(12) United States Patent
Kaneda et al.

(10) Patent No.: US 11,437,976 B2
(45) Date of Patent: Sep. 6, 2022

(54) ACOUSTIC WAVE FILTER WITH SHUNT RESONATOR HAVING MULTIPLE RESONANT FREQUENCIES

(71) Applicant: Skyworks Solutions, Inc., Irvine, CA (US)

(72) Inventors: Yasufumi Kaneda, Yokohama (JP); Yiliu Wang, Irvine, CA (US); Tomoya Komatsu, Irvine, CA (US)

(73) Assignee: Skyworks Solutions, Inc., Irvine, CA (US)

(\*) Notice: Subject to any disclaimer, the term of this patent is extended or adjusted under 35 U.S.C. 154(b) by 117 days.

(21) Appl. No.: 16/865,688

(22) Filed: May 4, 2020

(65) Prior Publication Data

US 2020/0358424 A1    Nov. 12, 2020

Related U.S. Application Data

(60) Provisional application No. 62/843,973, filed on May 6, 2019, provisional application No. 62/843,988, filed on May 6, 2019.

(51) Int. Cl.
| | |
|---|---|
| *H03H 9/145* | (2006.01) |
| *H03H 9/02* | (2006.01) |
| *H03H 9/64* | (2006.01) |
| *H03H 9/25* | (2006.01) |
| *H03H 9/72* | (2006.01) |
| *H04B 1/00* | (2006.01) |

(52) U.S. Cl.
CPC .... *H03H 9/14544* (2013.01); *H03H 9/02228* (2013.01); *H03H 9/02574* (2013.01); *H03H 9/02834* (2013.01); *H03H 9/14541* (2013.01); *H03H 9/25* (2013.01); *H03H 9/6409* (2013.01); *H03H 9/725* (2013.01); *H04B 1/0057* (2013.01)

(58) Field of Classification Search
CPC .... H03H 9/25; H03H 9/6409; H03H 9/14541; H03H 9/725; H03H 9/02574; H03H 9/02228; H03H 9/02834; H03H 9/6483; H03H 9/6476; H03H 9/175; H03H 9/14544; H03H 9/14582; H04B 1/0057
USPC .......................................... 333/133, 193–196
See application file for complete search history.

(56) References Cited

U.S. PATENT DOCUMENTS

| | | |
|---|---|---|
| 6,259,336 B1 | 7/2001 | Ichikawa |
| 7,138,889 B2 | 11/2006 | Lakin |
| 10,389,391 B2 | 8/2019 | Ito et al. |

(Continued)

OTHER PUBLICATIONS

Kadota, Michio, RF Filter using Boundary Acoustic Wave., Japanese Journal of Applied Physics, May 2006, pp. 4651-4654.

*Primary Examiner* — Rakesh B Patel
*Assistant Examiner* — Jorge L Salazar, Jr.
(74) *Attorney, Agent, or Firm* — Knobbe, Martens, Olson & Bear, LLP

(57) ABSTRACT

Aspects of this disclosure relate to an acoustic wave resonator having at least two resonant frequencies. An acoustic wave filter can include series acoustic wave resonators and shunt acoustic wave resonators together arranged to filter a radio frequency signal. A first shunt resonator of the shunt acoustic wave resonators can include an interdigital transducer electrode and have at least a first resonant frequency and a second resonant frequency. Related acoustic wave resonators, multiplexers, wireless devices, and methods are disclosed.

20 Claims, 17 Drawing Sheets

(56) References Cited

U.S. PATENT DOCUMENTS

| | | | |
|---|---|---|---|
| 2012/0188026 A1 | 7/2012 | Yamaji et al. | |
| 2014/0049341 A1 | 2/2014 | Komatsu et al. | |
| 2014/0070906 A1 | 3/2014 | Ikeuchi et al. | |
| 2018/0138892 A1* | 5/2018 | Caron | H04L 5/001 |
| 2018/0294797 A1* | 10/2018 | Ozasa | H03H 9/25 |
| 2021/0119609 A1 | 4/2021 | Kaneda et al. | |

* cited by examiner

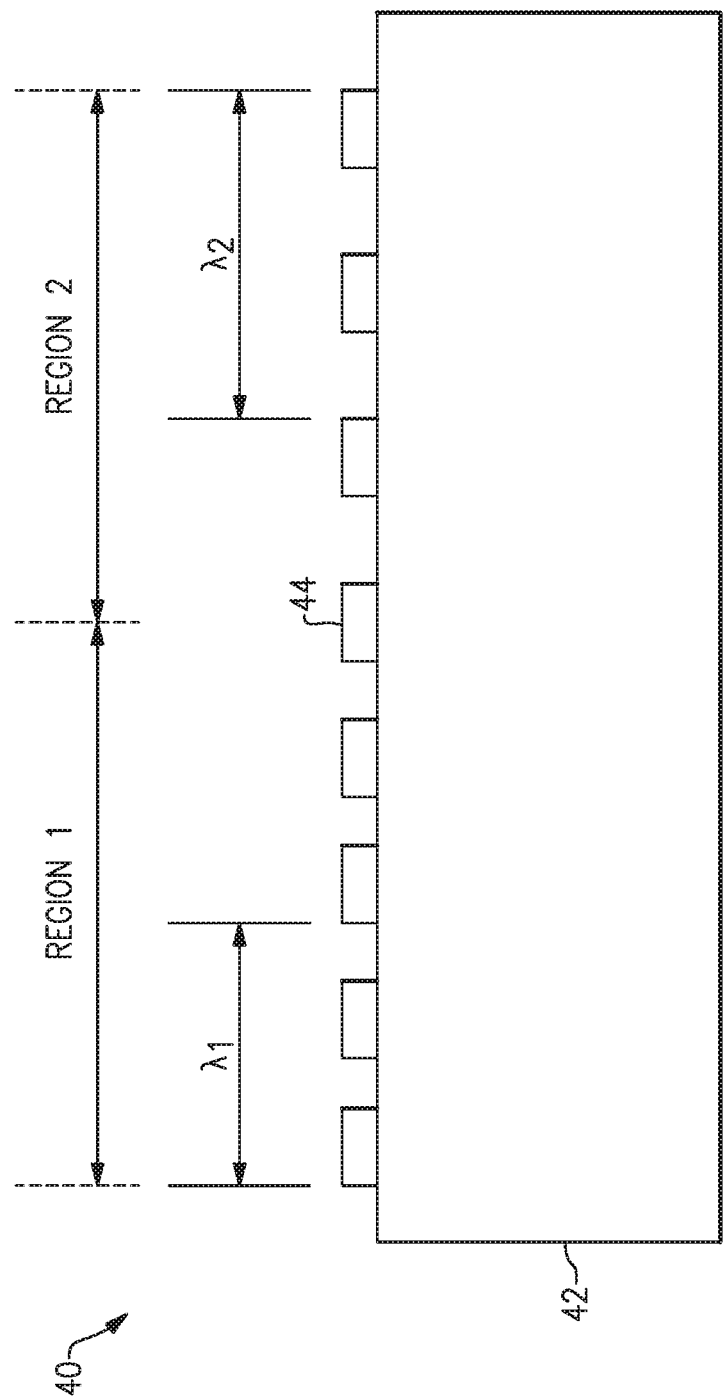

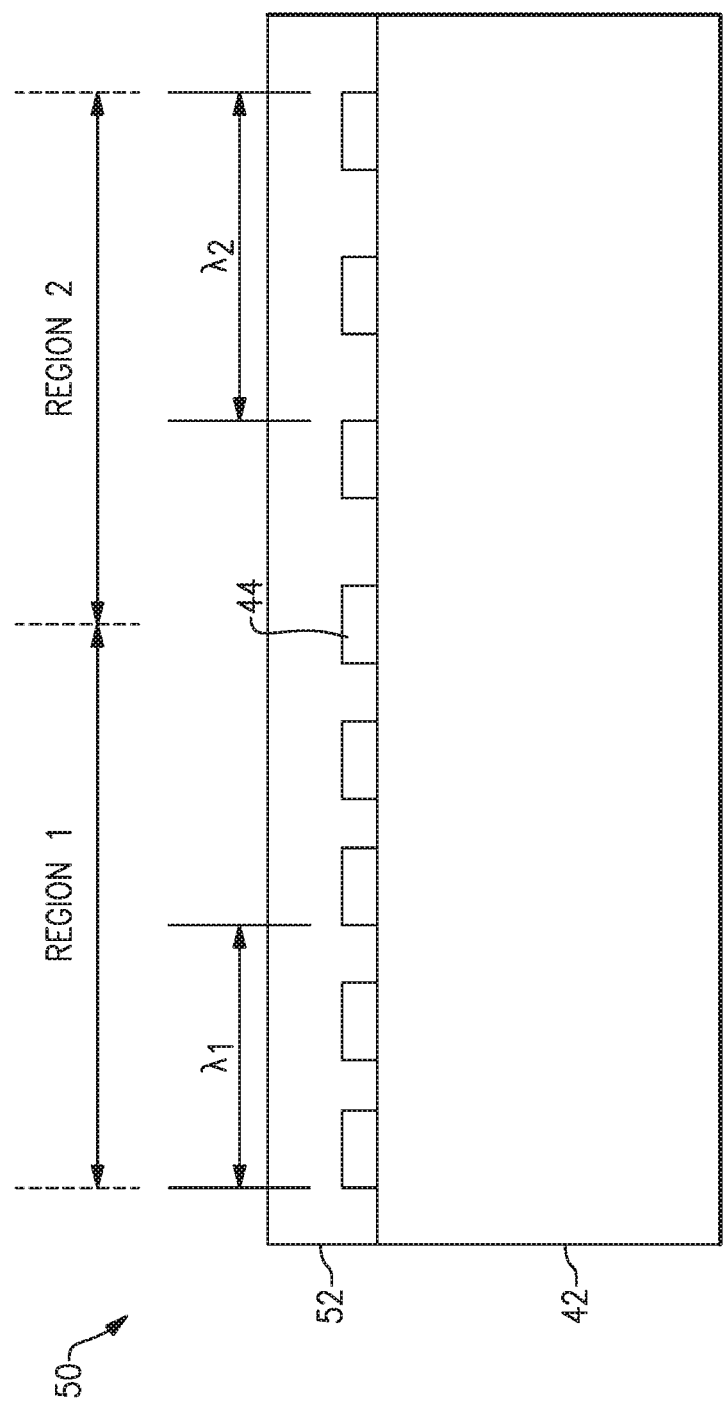

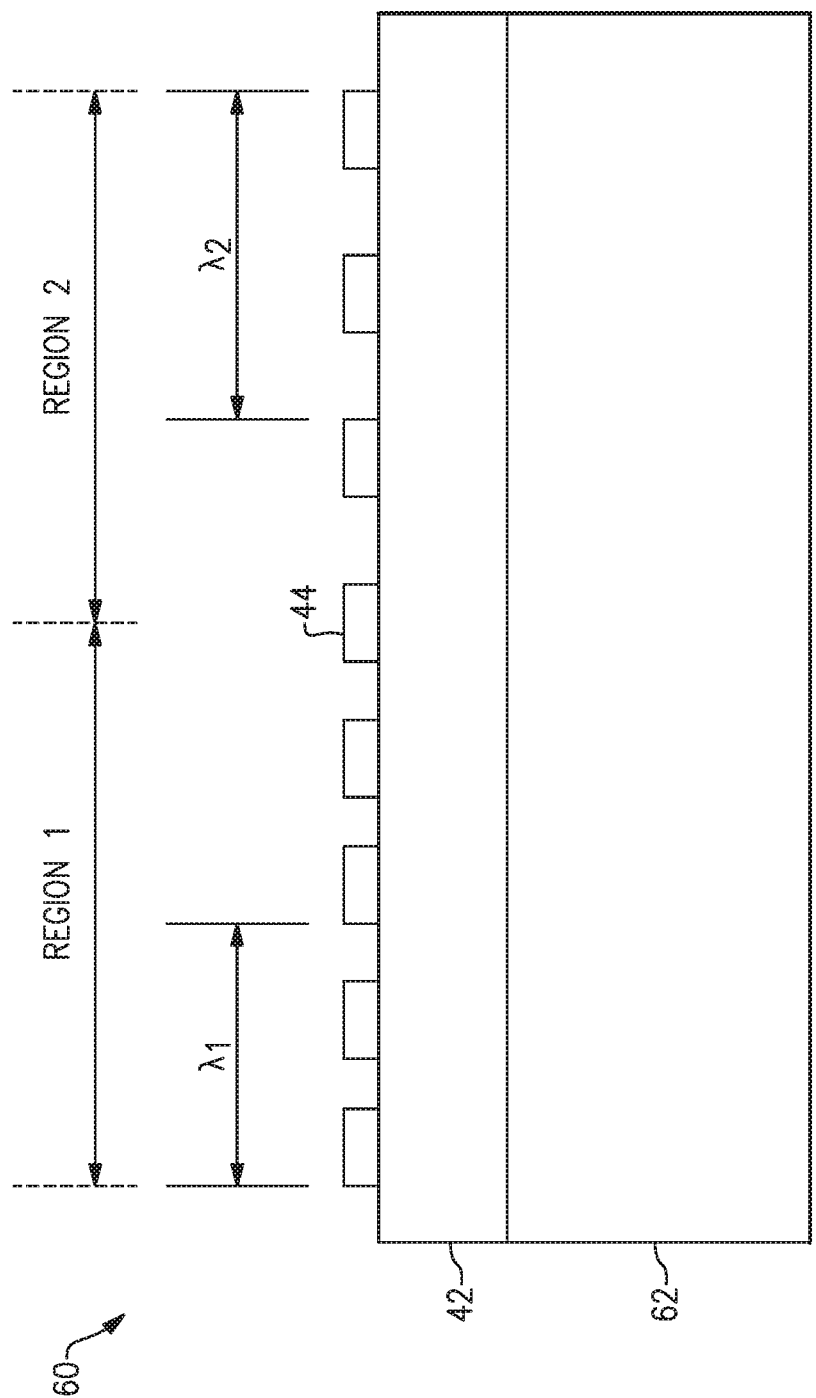

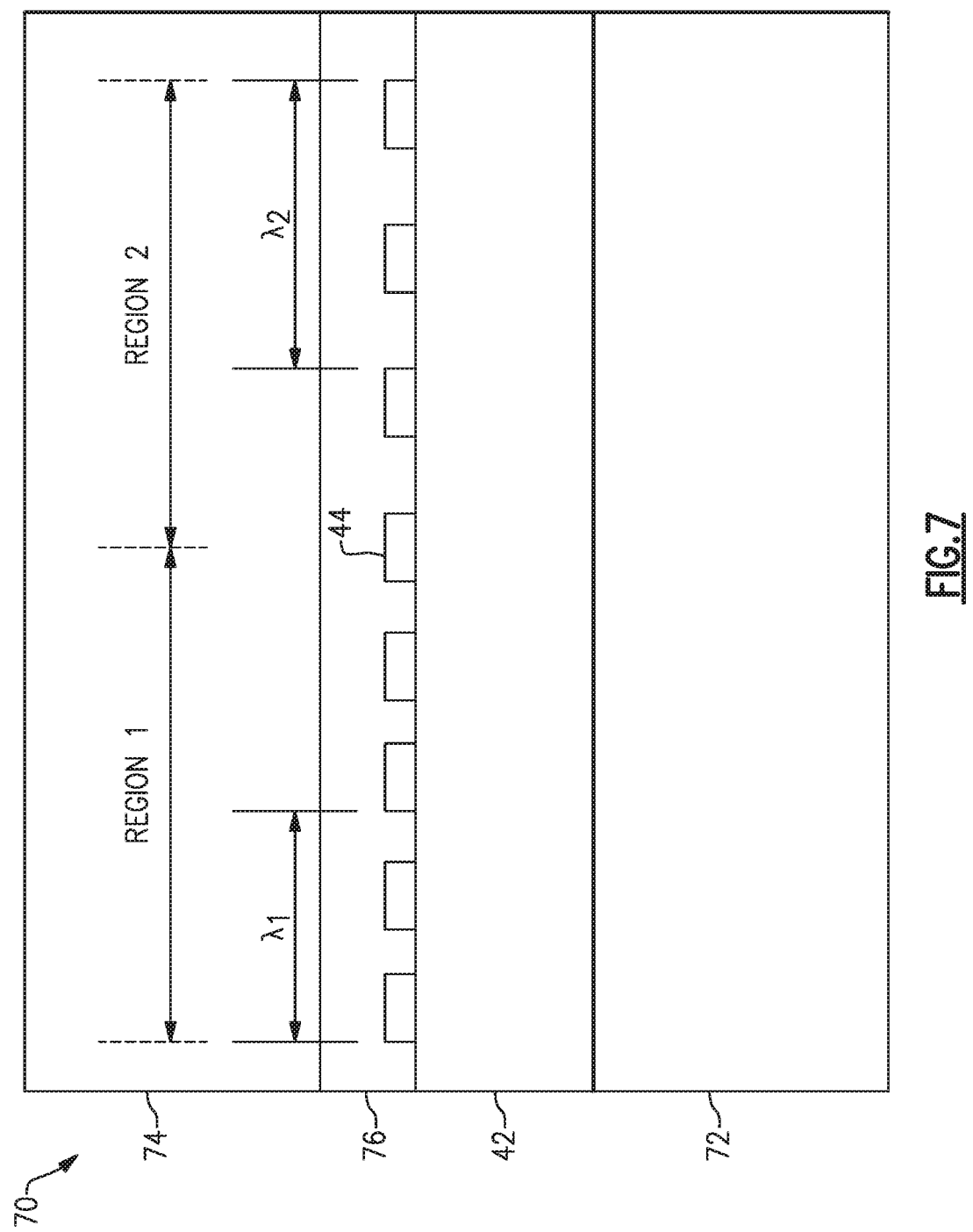

ACOUSTIC WAVE FILTER WITH SHUNT RESONATOR HAVING MULTIPLE RESONANT FREQUENCIES

CROSS REFERENCE TO PRIORITY APPLICATIONS

This application claims the benefit of priority of U.S. Provisional Patent Application No. 62/843,973, filed May 6, 2019 and titled "ACOUSTIC WAVE FILTER WITH SHUNT RESONATOR HAVING MULTIPLE RESONANT FREQUENCIES," and also claims the benefit of priority of U.S. Provisional Patent Application No. 62/843,988, filed May 6, 2019 and titled "ACOUSTIC WAVE RESONATOR WITH MULTIPLE RESONANT FREQUENCIES," the disclosures of each which are hereby incorporated by reference in their entireties herein.

BACKGROUND

Technical Field

Embodiments of this disclosure relate to acoustic wave resonators with two or more resonant frequencies.

Description of Related Technology

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed.

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer. An acoustic wave filter with rejection over a relatively wide frequency range outside of a passband can be desirable. Designing such a filter can be challenging.

SUMMARY

The innovations described in the claims each have several aspects, no single one of which is solely responsible for its desirable attributes. Without limiting the scope of the claims, some prominent features of this disclosure will now be briefly described.

One aspect of this disclosure is an acoustic wave filter configured to filter a radio frequency signal. The acoustic wave filter includes shunt acoustic wave resonators including a first shunt acoustic wave resonator. The first shunt acoustic wave resonator includes an interdigital transducer electrode. The first shunt acoustic resonator has at least a first resonant frequency and a second resonant frequency. The acoustic wave filter includes series acoustic wave resonators. The series acoustic wave resonators and the shunt acoustic wave resonators are together arranged to filter a radio frequency signal.

The acoustic wave filter can be a band pass filter having a pass band. The second resonant frequency can be between the first resonant frequency and an edge of the pass band. The second resonant frequency can be at least 5 megahertz above the first resonant frequency.

The interdigital transducer electrode can include first interdigital transducer electrode fingers having a first pitch corresponding to the first resonant frequency, and the interdigital transducer electrode can include second interdigital transducer electrode fingers having a second pitch corresponding to the second resonant frequency.

The first shunt acoustic wave resonator can be a surface acoustic wave resonator. The first shunt acoustic wave resonator can be a temperature compensated surface acoustic wave resonator. The first shunt acoustic wave resonator can be a multilayer piezoelectric substrate surface acoustic wave resonator. The first shunt acoustic wave resonator can be a Lamb wave resonator. The first shunt acoustic wave resonator can be a boundary acoustic wave resonator.

The first shunt acoustic wave resonator can have a third resonant frequency.

The shunt acoustic wave resonators can include a second shunt acoustic wave resonator having a plurality of resonant frequencies.

Another aspect of this disclosure is a multiplexer with filters for filtering radio frequency signals. The multiplexer includes a first filter including series acoustic wave resonators and shunt acoustic wave resonators together arranged to filter a first radio frequency signal. The shunt acoustic wave resonators include a first shunt acoustic wave resonator. The first shunt resonator includes an interdigital transducer electrode. The first shunt acoustic wave resonator has a plurality of resonant frequencies. The multiplexer also includes a second filter coupled to the first filter at a common node. The second filter is configured to filter a second radio frequency signal.

The interdigital transducer electrode can include first interdigital transducer electrode fingers having a first pitch corresponding to the first resonant frequency, and the interdigital transducer electrode can include second interdigital transducer electrode fingers having a second pitch corresponding to the second resonant frequency.

The second filter can include second series acoustic wave resonators and second shunt acoustic wave resonators. The second shunt acoustic wave resonators can include a second shunt acoustic wave resonator having at least two resonant frequencies.

The multiplexer can further include: a third filter coupled to the common node, the third filter configured to filter a third radio frequency signal; and a fourth filter coupled to the common node, the fourth filter configured to filter a fourth radio frequency signal. The multiplexer can provide filtering for at least two carriers of a carrier aggregation. Each filter of the multiplexer can be an acoustic wave filter.

The first shunt acoustic wave resonator can include any suitable combination of features of the acoustic wave resonators having two or more resonant frequencies disclosed herein.

The second filter can include an acoustic wave resonator that includes any suitable combination of features of the acoustic wave resonators having two or more resonant frequencies disclosed herein.

Another aspect of this disclosure is a method of filtering a radio frequency signal with an acoustic wave filter. The method includes: receiving, by an acoustic wave filter, a radio frequency signal; and generating, by a shunt acoustic wave resonator including an interdigital transducer electrode and being included in the acoustic wave filter, a plurality of notches in a frequency response of the shunt acoustic wave resonator to thereby improve rejection of the acoustic wave filter.

The interdigital transducer electrode can include first interdigital transducer electrode fingers having a first pitch corresponding to a first resonant frequency that creates a first notch of the plurality of notches, and the interdigital transducer electrode can include second interdigital transducer electrode fingers having a second pitch corresponding to a second resonant frequency that creates a second notch of the plurality of notches. The acoustic wave filter can be a band pass filter having a pass band. The second resonant frequency can be between the first resonant frequency and a lower edge of the pass band. The acoustic wave filter can include any suitable combination of features of the acoustic wave filters disclosed herein.

Another aspect of this disclosure is an acoustic wave filter configured to filter a radio frequency signal. The acoustic wave filter includes shunt acoustic wave resonators including a first shunt acoustic wave resonator. The first shunt acoustic wave resonator has at least a first resonant frequency and a second resonant frequency. The acoustic wave filter includes series acoustic wave resonators. The series acoustic wave resonators and the shunt acoustic wave resonators are together arranged to filter a radio frequency signal.

Another aspect of this disclosure is an acoustic wave resonator with a plurality of resonant frequencies. The acoustic wave resonator includes a piezoelectric layer and an interdigital transducer electrode on the piezoelectric layer. The interdigital transducer electrode includes first interdigital transducer electrode fingers and second interdigital transducer electrode fingers. The first interdigital transducer electrode fingers have a first pitch corresponding to a first resonant frequency. The second interdigital transducer electrode fingers having a second pitch corresponding to a second resonant frequency.

The second resonant frequency can be between the first resonant frequency and an edge of a pass band of an acoustic wave filter that includes the acoustic wave resonator. The edge can be a lower edge of the passband.

The acoustic wave resonator can be configured to generate a surface acoustic wave.

The acoustic wave resonator can further include a temperature compensation layer over the interdigital transducer electrode. The temperature compensation layer can be a silicon dioxide layer.

The acoustic wave resonator can further include a support substrate, in which the piezoelectric layer is positioned on the support substrate.

The acoustic wave resonator can be configured to generate a boundary acoustic wave.

The acoustic wave resonator can be configured to generate a Lamb wave.

The interdigital transducer electrode can include third interdigital transducer electrode fingers having a third pitch corresponding to a third resonant frequency of the acoustic wave resonator.

The second resonant frequency can be at least 5 megahertz above the first resonant frequency. The second resonant frequency can be between the first resonant frequency and an edge of a passband of a filter that includes the acoustic wave resonator. The edge can be a lower edge of the passband.

The piezoelectric layer can be a lithium niobate layer. The piezoelectric layer can be a lithium tantalate layer. The piezoelectric layer can be an aluminum nitride layer.

The interdigital transducer electrode can include a bus bar from which both the first interdigital transducer electrode fingers and the second interdigital transducer electrode fingers extend. The interdigital transducer electrode can be positioned between two acoustic reflectors that are on the piezoelectric layer.

Another aspect of this disclosure is an acoustic wave filter configured to filter a radio frequency signal. The acoustic wave filter includes a plurality of acoustic wave resonators. The plurality of acoustic wave resonators include a shunt acoustic wave resonator that includes a piezoelectric layer and an interdigital transducer electrode on the piezoelectric layer. The interdigital transducer electrode includes first interdigital transducer electrode fingers and second interdigital transducer electrode fingers. The first interdigital transducer electrode fingers have a first pitch corresponding to a first resonant frequency. The second interdigital transducer electrode fingers have a second pitch corresponding to a second resonant frequency.

The shunt acoustic wave resonator can one or more suitable features additional features of any of the acoustic wave resonators disclosed herein.

Another aspect of this disclosure is a multiplexer with filters for filtering radio frequency signals. The multiplexer includes: a first filter including a shunt acoustic wave resonator, the shunt acoustic wave resonator including a piezoelectric layer and an interdigital transducer electrode on the piezoelectric layer, the interdigital transducer electrode including first interdigital transducer electrode fingers and second interdigital transducer electrode fingers, the first interdigital transducer electrode fingers having a first pitch corresponding to a first resonant frequency, and the second interdigital transducer electrode fingers having a second pitch corresponding to a second resonant frequency; and a second filter coupled to the first filter at a common node, the second filter configured to filter a second radio frequency signal.

The second filter can include acoustic wave resonators.

The multiplexer can further include: a third filter coupled to the common node, the third filter configured to filter a third radio frequency signal; and a fourth filter coupled to the common node, the fourth filter configured to filter a fourth radio frequency signal. Each of the second filter, the third filter, and the fourth filter can be an acoustic wave filter. The multiplexer can be configured to provide filtering for at least two carriers of a carrier aggregation.

The shunt acoustic wave resonator can include one or more suitable features of any of the acoustic wave resonators disclosed herein.

Another aspect of this disclosure is a method of filtering a radio frequency signal with an acoustic wave filter. The method includes: receiving, by an acoustic wave filter, a radio frequency signal; and generating, by a shunt acoustic wave resonator of the acoustic wave filter that includes an interdigital transducer electrode including first interdigital transducer electrode fingers having a first pitch and second interdigital transducer electrode fingers having a second pitch, two notches in a frequency response of the shunt acoustic wave resonator corresponding to the first pitch and the second pitch to thereby improve rejection of the acoustic wave filter.

The shunt acoustic wave resonator can include one or more suitable features of any of the acoustic wave resonators disclosed herein.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 4 is a diagram of a cross section of a SAW resonator according to an embodiment.

FIG. 5 is a diagram of a cross section of a temperature compensated SAW resonator according to an embodiment.

FIG. 6 is a diagram of a cross section of a multilayer piezoelectric substrate SAW resonator according to an embodiment.

FIG. 7 is a diagram of a cross section of a boundary wave resonator according to an embodiment.

DETAILED DESCRIPTION OF CERTAIN EMBODIMENTS

Figure 1:
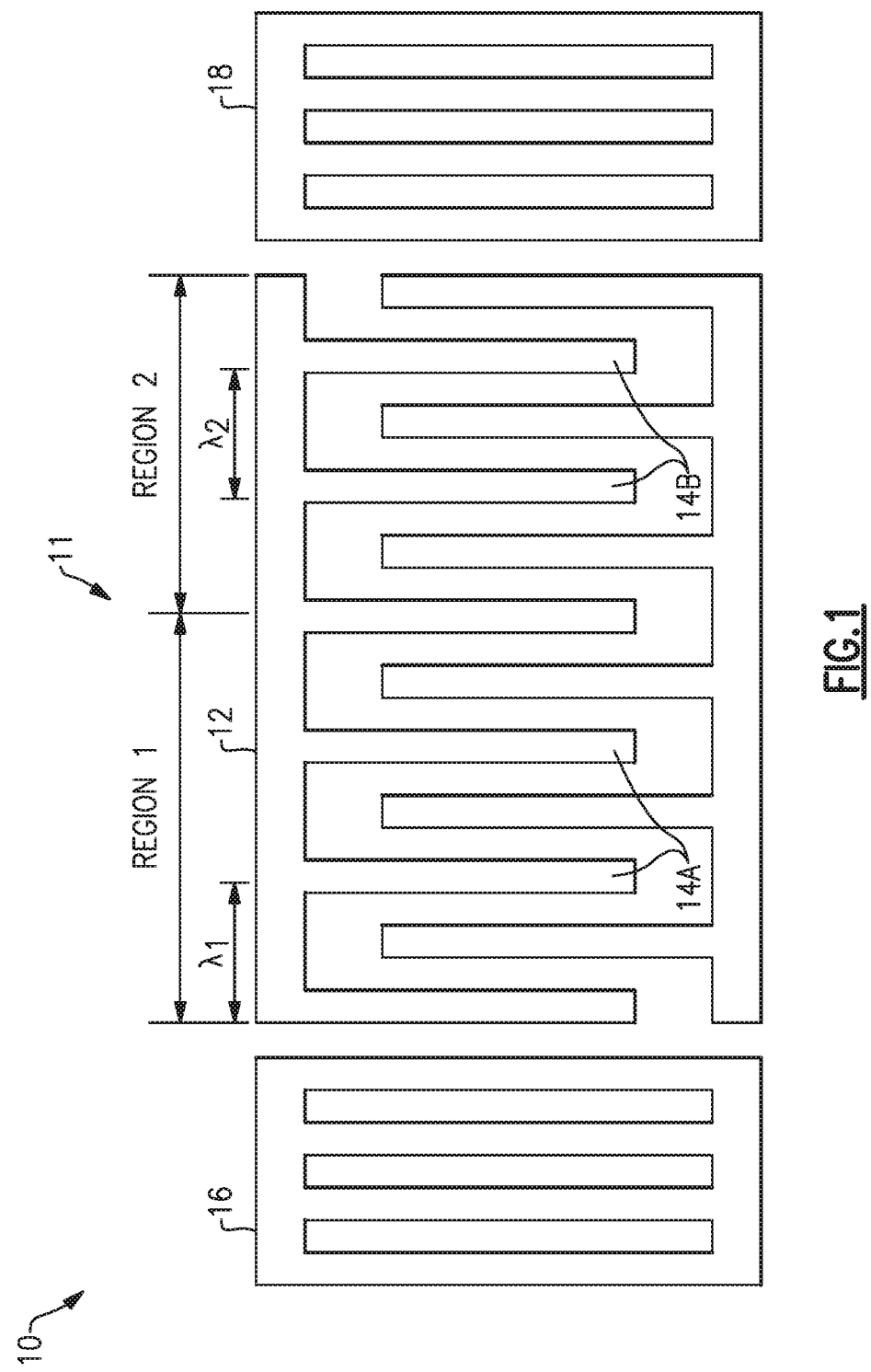
FIG. 1 is a diagram of an acoustic wave resonator with interdigital transducer (IDT) electrode with two different pitches between IDT fingers according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Filters with rejection over a relatively wide frequency range are desired for certain radio frequency (RF) systems. Acoustic wave filters can include series acoustic wave resonators and shunt acoustic wave resonators. An anti-resonance frequency of a series acoustic wave resonator can be used for rejection in an acoustic wave filter. The anti-resonance frequency of the series acoustic wave resonator can create an open to thereby create a notch in a frequency response. A resonant frequency of a shunt acoustic wave resonator can be used for rejection in an acoustic wave filter. The resonant frequency of the shunt acoustic wave resonator can create a short to ground to thereby create a notch in a frequency response. The series acoustic wave resonator can have its highest conductance at the resonant frequency.

To achieve a relatively wide frequency range for rejection, an acoustic wave filter can include a plurality of shunt acoustic wave resonators each having a different resonant frequency. As an example, an acoustic wave filter can include 4 or 5 shunt acoustic wave resonators each having different respective resonant frequencies. With more shunt acoustic wave resonators having different resonant frequencies, the acoustic wave filter can achieve relatively higher rejection. At the same time, an acoustic wave filter with more acoustic wave resonators can consume additional area.

Aspects of this disclosure relate to an acoustic wave resonator having at least two resonant frequencies. The acoustic wave resonator can be arranged as a shunt resonator in an acoustic wave filter. Such a shunt resonator can achieve at least two notches and increase a frequency range for rejection of the acoustic wave filter. The acoustic wave filter can be a band pass filter with a pass band. The acoustic wave resonator can have a second resonant frequency between a first resonant frequency and a lower edge of the pass band.

An acoustic wave resonator with at least two resonant frequencies can include an interdigital transducer (IDT) electrode with first IDT fingers having a first pitch corresponding to a first resonant frequency and second IDT fingers having a second pitch corresponding to a second resonant frequency. The acoustic wave resonator can be a surface acoustic wave (SAW) resonator. For example, the acoustic wave resonator can be a temperature compensated SAW resonator, a non-temperature compensated SAW resonator, or a multilayer piezoelectric substrate SAW resonator. Other types of acoustic wave resonators with an IDT electrode having at least two pitches corresponding to two resonant frequencies are disclosed, such as boundary wave resonators and Lamb wave resonators.

A shunt acoustic wave resonator with multiple resonant frequencies can improve out of band rejection for a filter without significantly degrading the filter response in a pass band. With a shunt acoustic wave resonator with multiple resonant frequencies, stringent rejection specifications can be met with fewer acoustic wave resonators than some previous solutions.

FIG. 1 is a diagram of an acoustic wave resonator 10 with an IDT electrode 11 with two different pitches between IDT fingers according to an embodiment. The acoustic wave resonator 10 is shown in plan view. The acoustic wave resonator 10 can be a SAW resonator in certain embodiments. As illustrated, the acoustic wave resonator 10 includes an IDT electrode 11 including a bus bar 12, first IDT fingers 14A, second IDT fingers 14B, a first acoustic reflector 16, and a second acoustic reflector 18. The IDT electrode 11 and the acoustic reflectors 16 and 18 can be positioned on a piezoelectric layer. The acoustic reflectors 16 and 18 are separated from the IDT electrode 12 by respective gaps.

The IDT electrode 11 is positioned between the first acoustic reflector 16 and the second acoustic reflector 18. The IDT electrode 11 includes a bus bar 12 and IDT fingers 14A and 14B extending from the bus bar 12. In Region 1 of the acoustic wave resonator 10, the first IDT fingers 14A have a pitch of λ1. The acoustic wave resonator 10 can include any suitable number of first IDT fingers 14A. The pitch λ1 of the first IDT fingers 14A corresponds to a first resonant frequency. In Region 2 of the acoustic wave resonator 10, the second IDT fingers 14B have a pitch of λ2. The acoustic wave resonator 10 can include any suitable number of second IDT fingers 14B. The pitch λ2 of the second IDT fingers 14B corresponds to a second resonant frequency. Accordingly, the acoustic wave resonator 10 has IDT fingers with two different pitches that correspond to two different resonant frequencies.

Figure 2A:
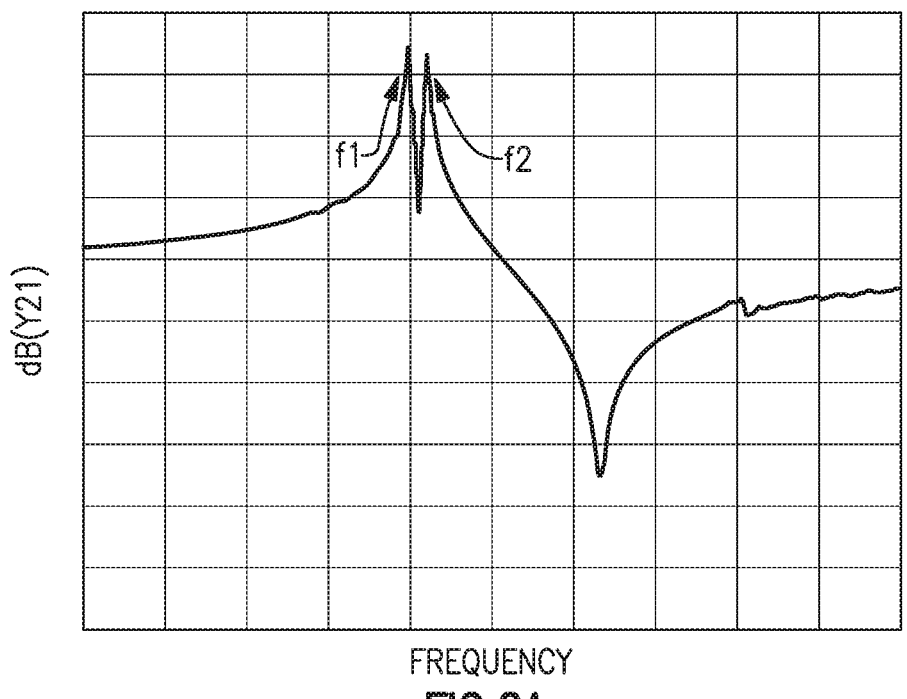
FIG. 2A is a graph of conductance for a surface acoustic wave (SAW) resonator with the IDT of FIG. 1.

FIG. 2A is a graph of conductance for a SAW resonator with the IDT 11 of FIG. 1. As shown in FIG. 2A, the conductance graph has peaks at two frequencies f1 and f2. The frequencies f1 and f2 correspond to the pitches λ1 and λ2, respectively, of the IDT 11 of FIG. 1. The first resonant frequency f1 is distinct from the second resonant frequency f2. In certain instances, the second resonant frequency f2 is at least 5 megahertz (MHz) above the first resonant frequency f1. The second resonant frequency f2 can also be between the first resonant frequency f1 and a lower edge of a pass band of a filter that includes the SAW resonator.

Figure 2B:
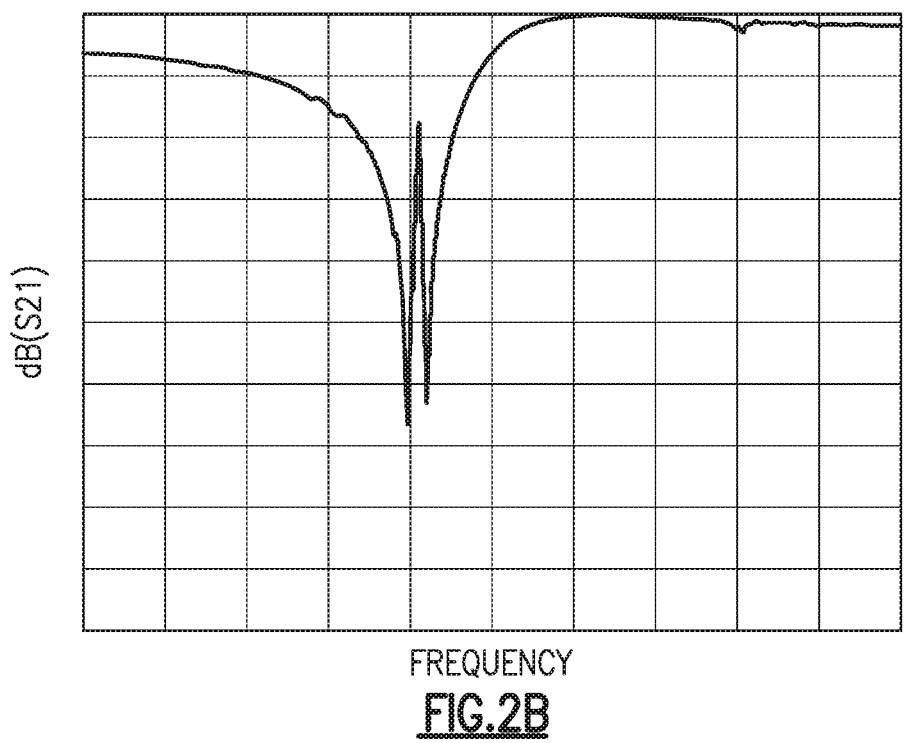
FIG. 2B is a graph of a frequency response for a SAW resonator with the IDT of FIG. 1.

FIG. 2B is a graph of a frequency response for a SAW resonator with the IDT 11 of FIG. 1. The SAW resonator is arranged as a shunt resonator. The two notches in the frequency response shown in FIG. 2B are at the resonant frequencies f1 and f2 shown in FIG. 2A. The two notches can be referred to as rejection poles.

A shunt SAW resonator corresponding to the graphs of FIGS. 2A and 2B can have two resonance peaks. For example, a shunt SAW resonator can have the resonance peaks at resonant frequencies f1 and f2 are shown in FIG. 2A. The shunt SAW resonator can be included in a band pass filter with a pass band. The first resonant frequency f1 is below the second resonant frequency f2. The second resonant frequency f2 can be below a lower edge of the pass band of the band pass filter. With such a shunt SAW resonator, rejection below the pass band of the filter can be improved.

Figure 3A:
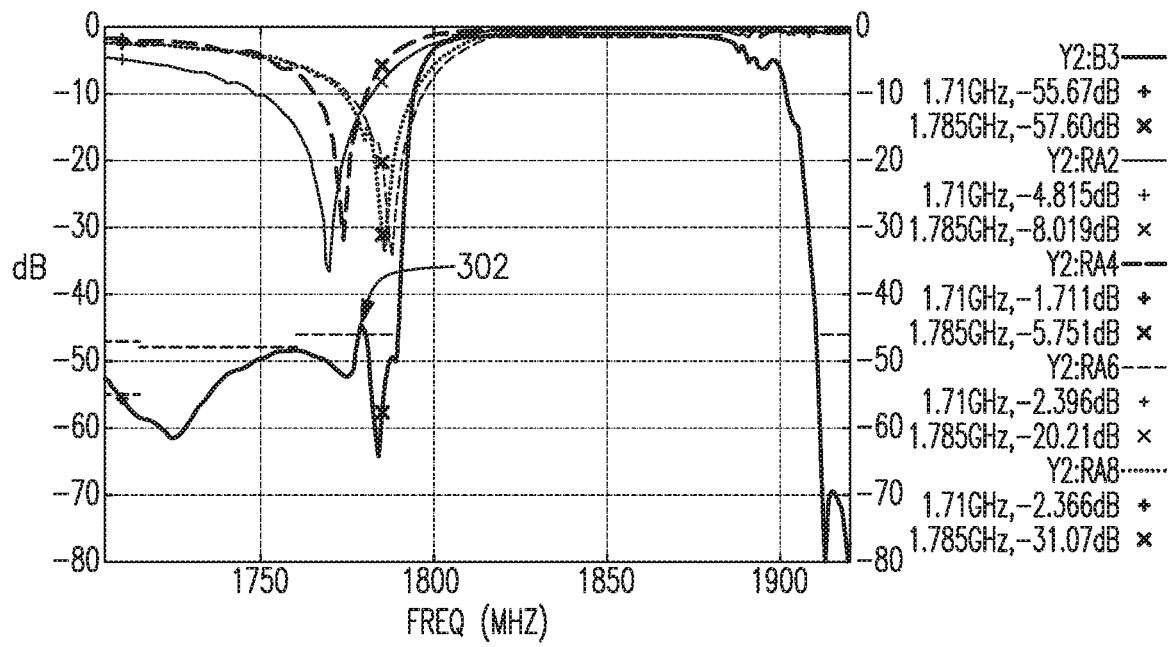
FIG. 3A is a graph of a frequency response of individual shunt resonators and a SAW filter that includes the resonators.

FIG. 3A is a graph of a frequency response of individual shunt resonators and a SAW ladder filter that includes the resonators. FIG. 3A illustrates a ripple 302 in the frequency response of the SAW filter that is above a rejection specification.

Figure 3B:
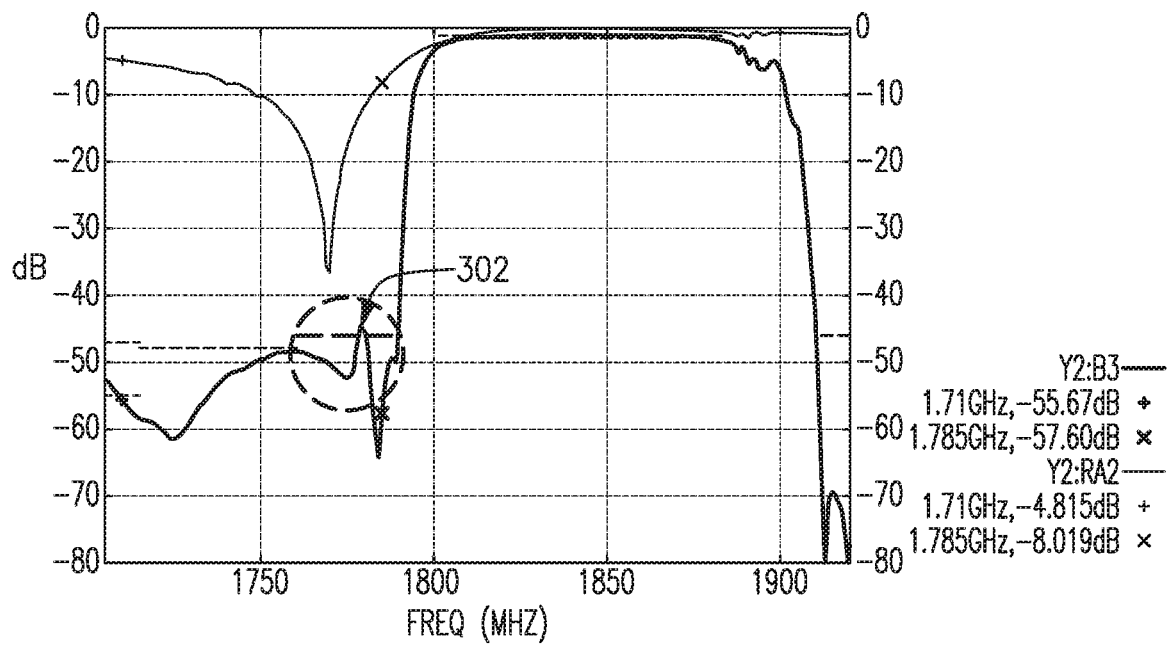
FIG. 3B is a graph of a frequency response of one shunt resonator and a SAW filter that includes the shunt resonator.

FIG. 3B is a graph of a frequency response of one shunt resonator and a SAW ladder filter that includes the shunt resonator. The graph of the one shunt resonator that can contribute most to the ripple 302 in the frequency response of the SAW filter is shown in FIG. 3B together with the frequency response. The ripple 302 brings the frequency response of the SAW filter outside of the specification for out of band rejection.

Figure 3C:
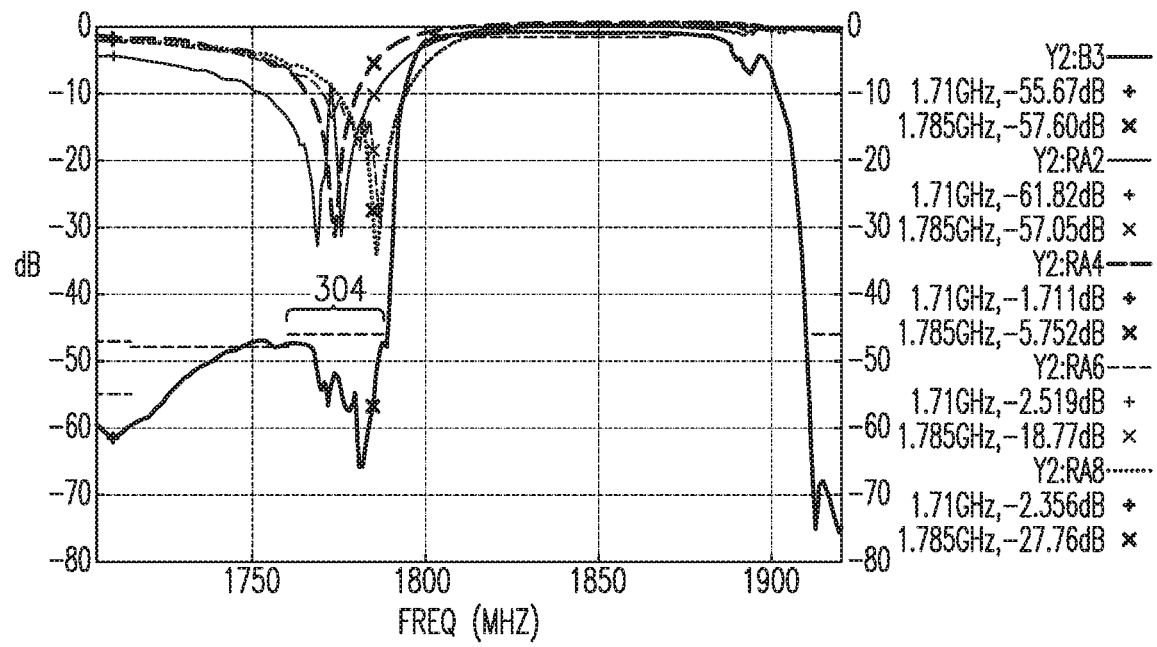
FIG. 3C is a graph of a frequency response of individual shunt resonators and a SAW filter with one shunt resonator having an IDT electrode similar to FIG. 1 according to an embodiment.

FIG. 3C is a graph of a frequency response of individual shunt resonators and a SAW ladder filter with one shunt resonator having an IDT electrode similar to FIG. 1 according to an embodiment. The SAW filter corresponding to FIGS. 3C and 3D has the topology of the filter 132 of FIG. 13A. The SAW filter corresponding to the graph of FIG. 3C is like the SAW filter corresponding to the graph of FIG. 3A except that the SAW filter corresponding to the graph of FIG. 3C includes one shunt SAW resonator with an IDT electrode similar to the IDT electrode 11 of FIG. 1. As shown in FIG. 3C, the shunt resonator having an IDT electrode similar to FIG. 1 can improve the out of band rejection of the SAW filter and bring the out of band rejection in compliance with the specification in region 304 of the filter frequency response. As an example, the SAW filter can be a receive filter and the graph of FIG. 3C can indicate an improvement in transmit band rejection relative to the graph of FIG. 3A that includes the ripple 302 that violates the specification.

Figure 3D:
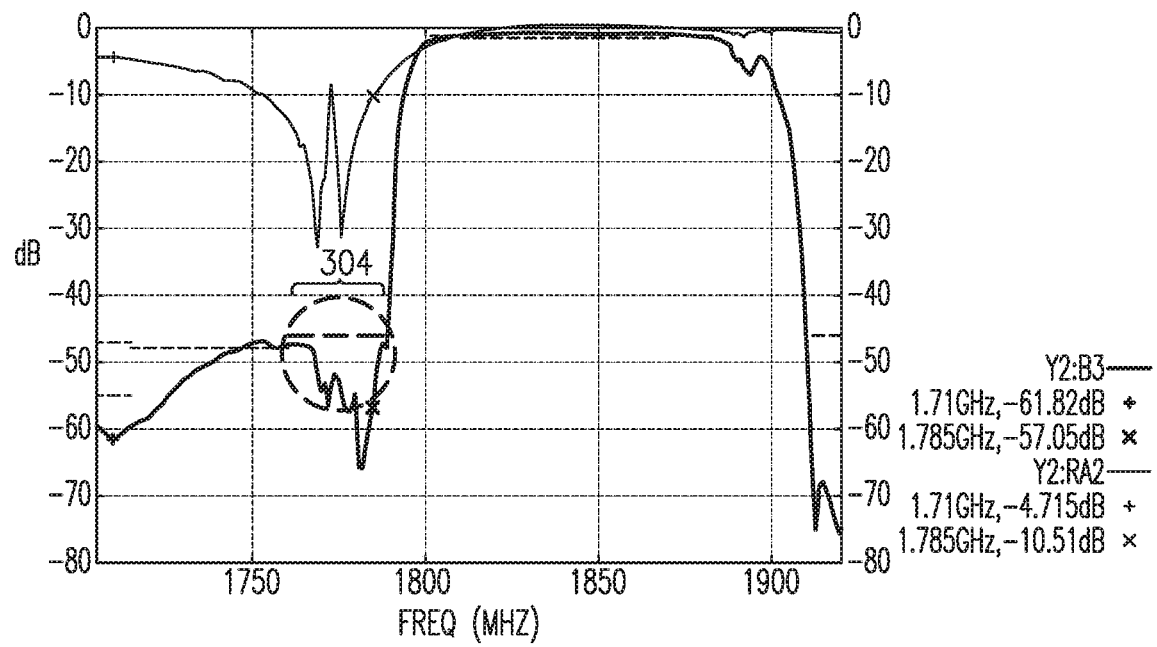
FIG. 3D is a graph of a frequency response of a shunt resonator having an IDT electrode similar to FIG. 1 and a SAW filter that includes the shunt resonator according to an embodiment.

FIG. 3D is a graph of a frequency response of a shunt resonator having an IDT electrode similar to FIG. 1 and a SAW ladder filter that includes the shunt resonator according to an embodiment. The shunt resonator having an IDT electrode similar to FIG. 1 has the lowest resonant frequency of the shunt resonators in the filter with the frequency response shown in FIG. 3D. The shunt resonator having an IDT electrode similar to FIG. 1 has two notches in its frequency response as shown in FIG. 3D. The two notches for the shunt SAW resonator shown in FIG. 3D are not as deep as the single notch for the corresponding resonator with a uniform IDT electrode finger pitch that is shown in FIG. 3B. A shunt resonator with a two resonant frequencies relatively far away from an edge of the passband of the filter that includes the shunt resonator can meet performance specifications with the reduced depths of the notches at the two resonant frequencies. The shunt SAW resonator with the IDT electrode similar to FIG. 1 does not significantly degrade the pass band of the filter and also improves the out of band rejection. The shunt SAW resonator with the IDT electrode similar to FIG. 1 can advantageously increase the rejection frequency range without adding additional components, such as other resonators.

An acoustic wave resonator having multiple resonant frequencies can be a SAW resonator. Such a SAW resonator can include a piezoelectric layer and an IDT electrode on the piezoelectric layer. The IDT electrode includes first IDT fingers having a first pitch corresponding to a first resonant frequency and second IDT fingers having a second pitch corresponding to a second resonant frequency. Example SAW resonators will be discussed with reference to FIGS. 4 to 6.

FIG. 4 is a diagram of a cross section of a SAW resonator 40 according to an embodiment. The SAW resonator 40 is an example of an acoustic wave resonator having multiple resonant frequencies. The SAW resonator 40 is an example of a non-temperature compensated SAW resonator. SAW filters disclosed herein can include any suitable number of SAW resonators 40. The illustrated SAW resonator 40 includes a piezoelectric layer 42 and an IDT electrode 44 on the piezoelectric layer 42. The piezoelectric layer 42 can be a lithium niobate layer or a lithium tantalate layer, for example. As shown in FIG. 4, the IDT electrode 44 includes first IDT electrode fingers in Region 1 having a pitch of $\lambda 1$ and second IDT electrode fingers in Region 2 having a pitch of $\lambda 2$. With different pitches for the first and second IDT electrode fingers, the SAW resonator 40 can have two resonant frequencies. The two resonant frequencies can correspond to two notches in the frequency response of the SAW resonator 40. The SAW resonator 40 can be included as a shunt resonator in a filter to improve out of band rejection.

FIG. 5 is a diagram of a cross section of a temperature compensated SAW (TCSAW) resonator 50 according to an embodiment. The TCSAW resonator 50 is an example of an acoustic wave resonator having multiple resonant frequencies. SAW filters disclosed herein can include any suitable number of TCSAW resonators 50. The illustrated TCSAW resonator 50 includes a piezoelectric layer 42, an IDT electrode 44 on the piezoelectric layer 42, and a temperature compensation layer 52 over the IDT electrode 44. The piezoelectric layer 42 can be a lithium niobate substrate or a lithium tantalate substrate, for example.

The temperature compensation layer 52 can bring the temperature coefficient of frequency (TCF) of the TCSAW resonator 50 closer to zero relative to a similar SAW resonator without the temperature compensation layer 52. The temperature compensation layer 52 can have a positive TCF. This can compensate for the piezoelectric layer 42 having a negative TCF. The temperature compensation layer 52 can be a silicon dioxide ($SiO_2$) layer. The temperature compensation layer 52 can include any other suitable temperature compensating material including without limitation a tellurium dioxide ($TeO_2$) layer or a silicon oxyfluoride (SiOF layer). The temperature compensation layer 52 can include any suitable combination of $SiO_2$, $TeO_2$, and/or SiOF.

As shown in FIG. 5, the IDT electrode 44 includes first IDT electrode fingers in Region 1 having a pitch of $\lambda 1$ and second IDT electrode fingers in Region 2 having a pitch of $\lambda 2$. With different pitches for the first and second IDT electrode fingers, the TCSAW resonator 50 can have two resonant frequencies. The two resonant frequencies can correspond to two notches in the frequency response of the TCSAW resonator 50. The TCSAW resonator 50 can be included as a shunt resonator in a filter to improve out of band rejection.

FIG. 6 is a diagram of a cross section of a multilayer piezoelectric substrate (MPS) SAW resonator 60 according to an embodiment. The MPS SAW resonator 60 is an example of an acoustic wave resonator having multiple resonant frequencies. SAW filters disclosed herein can include any suitable number of MPS SAW resonators 60. The illustrated MPS SAW resonator 60 includes a multilayer piezoelectric substrate including a piezoelectric layer 42 and a support substrate 62. The MPS SAW resonator 60 also includes an IDT electrode 44 on the piezoelectric layer 42.

The piezoelectric layer 42 can be a lithium niobate substrate or a lithium tantalate substrate, for example. In certain instances, the piezoelectric layer 42 can have a thickness of less than $\lambda$, in which $\lambda$ is a wavelength of a surface acoustic wave generated by the MPS SAW resonator 60. In some other instances, the piezoelectric layer 42 can have a thickness on the order of 10s of $\lambda$, in which $\lambda$ is a wavelength of a surface acoustic wave generated by the MPS SAW resonator 60. The thickness of the piezoelectric layer 42 can be in a range from about 20 microns to 30 microns in certain applications. The support substrate 62 can be a silicon substrate, a quartz substrate, a sapphire substrate, a polycrystalline spinel substrate, or any other suitable carrier substrate. As one example, the MPS SAW resonator 60 can include a piezoelectric substrate 42 that is lithium tantalate and a support substrate 62 that is silicon.

In some instances, one or more additional layers can be included in the multilayer piezoelectric substrate of an MPS SAW resonator. Non-limiting examples of a layer of the one or more additional layers include a silicon dioxide layer, a silicon nitride layer, an aluminum nitride layer, an adhesion layer, a dispersion adjustment layer, and a thermal dissipation layer. As an illustrative example, a multilayer piezoelectric substrate can include a lithium tantalate layer over a silicon dioxide layer over an aluminum nitride layer over a silicon layer. As one more illustrative example, a multilayer piezoelectric substrate can include a lithium niobate layer over a silicon dioxide layer over a high impedance layer, in which the high impedance layer has a higher acoustic impedance than the lithium niobate layer.

As shown in FIG. 6, the IDT electrode 44 includes first IDT electrode fingers in Region 1 having a pitch of $\lambda 1$ and second IDT electrode fingers in Region 2 having a pitch of $\lambda 2$. With different pitches for the first and second IDT electrode fingers, the MPS SAW resonator 60 can have two resonant frequencies. The two resonant frequencies can correspond to two notches in the frequency response of the MPS SAW resonator 60. The MPS SAW resonator 60 can be included as a shunt resonator in a filter to improve out of band rejection.

Another type of acoustic wave resonator that can have multiple resonant frequencies in accordance with any suitable principles and advantages disclosed herein is a boundary wave resonator. FIG. 7 is a diagram of a cross section of a boundary wave resonator 70 according to an embodiment. The boundary wave resonator 70 is an example of an acoustic wave resonator having multiple resonant frequencies. Acoustic wave filters disclosed herein can include any suitable number of boundary wave resonators 70. As illustrated, the boundary wave resonator 70 includes a piezoelectric layer 42, an interdigital transducer electrode 44 on the piezoelectric layer 42, high velocity layers 72 and 74 on opposing sides of the piezoelectric layer 42, and a low velocity layer 76 positioned between the piezoelectric layer 42 and a first high velocity layer 72 of the high velocity layers. The low velocity layer 76 has a lower acoustic velocity than the high velocity layers 72 and 74, in which the acoustic velocity is the speed of sound of a shear wave propagating in a solid. The boundary wave resonator 70 is configured to generate a boundary acoustic wave such that acoustic energy is concentrated at a boundary of the piezoelectric layer 42 and the low velocity layer 76. As one example, the low velocity layer 76 can be a silicon dioxide layer and the high velocity layers 72 and 74 can be silicon layers. As shown in FIG. 7, the IDT electrode 44 includes first IDT electrode fingers in Region 1 having a pitch of $\lambda 1$ and second IDT electrode fingers in Region 2 having a pitch of $\lambda 2$. These different pitches correspond to different resonant frequencies of the boundary acoustic wave resonator 70.

An acoustic wave resonator having multiple resonant frequencies can be a Lamb wave resonator. Example Lamb wave resonators will be discussed with reference to FIGS. 8 and 9.

Figure 8:
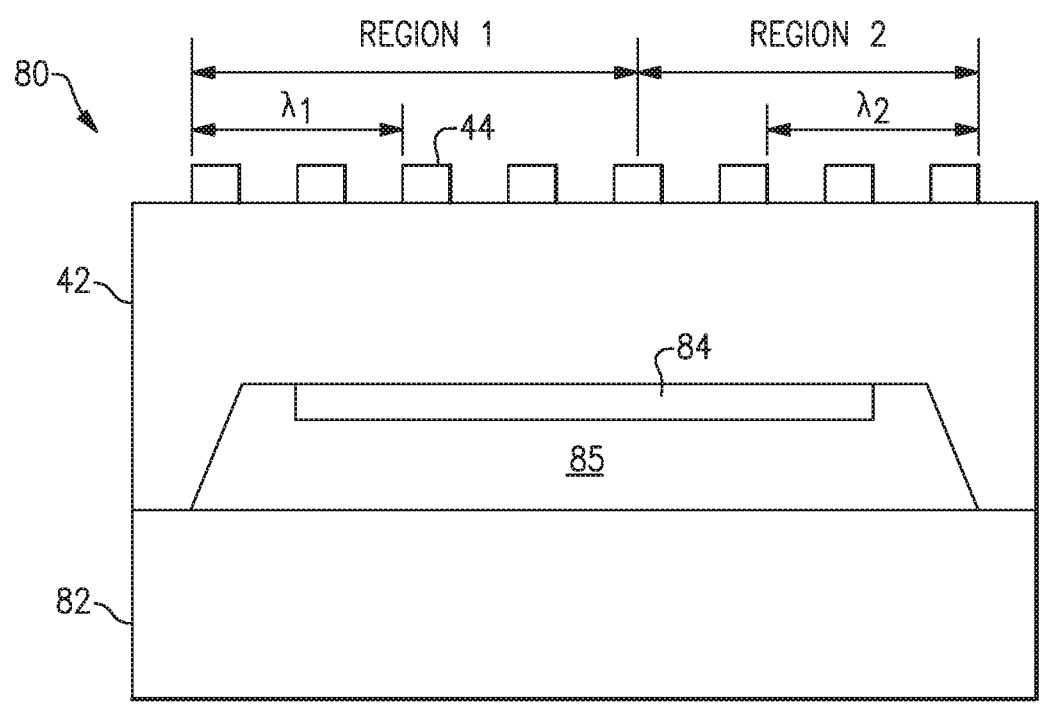
FIG. 8 is a diagram of a cross section of a Lamb wave resonator according to an embodiment.

FIG. 8 is a diagram of a cross section of a Lamb wave resonator 80 according to an embodiment. The Lamb wave resonator 80 is an example of an acoustic wave resonator having multiple resonant frequencies. Acoustic wave filters disclosed herein can include any suitable number of Lamb wave resonators 80. As illustrated, the Lamb wave resonator 80 includes a piezoelectric layer 42, an interdigital transducer electrode 44 on the piezoelectric layer 42, and an electrode 84. The piezoelectric layer 42 can be a thin film. The piezoelectric layer 42 can be an aluminum nitride layer. In other instances, the piezoelectric layer 42 can be any suitable piezoelectric layer. For example, the piezoelectric layer 42 can be a lithium niobate layer or a lithium tantalate layer. The electrode 84 and the IDT electrode 44 are on opposing sides of the piezoelectric layer 42. The electrode 84 can be grounded in certain instances. In some other instances, the electrode 84 can be floating. An air cavity 85 is disposed between the electrode 84 and a substrate 82. Any suitable cavity can be implemented in place of the air cavity 85. The substrate 82 can be a semiconductor substrate. For example, the substrate 82 can be a silicon substrate. The substrate 82 can be any other suitable substrate, such as a quartz substrate, a sapphire substrate, or a spinel substrate. As shown in FIG. 8, the IDT electrode 44 includes first IDT electrode fingers in Region 1 having a pitch of $\lambda 1$ and second IDT electrode fingers in Region 2 having a pitch of $\lambda 2$. These different pitches correspond to different resonant frequencies of the Lamb wave resonator 80. Alternatively or additionally, thickness of the piezoelectric layer 42 in the Lamb wave resonator 80 can be different in Region 1 and Region 2 to cause a difference in resonant frequency between Region 1 and Region 2.

Figure 9:
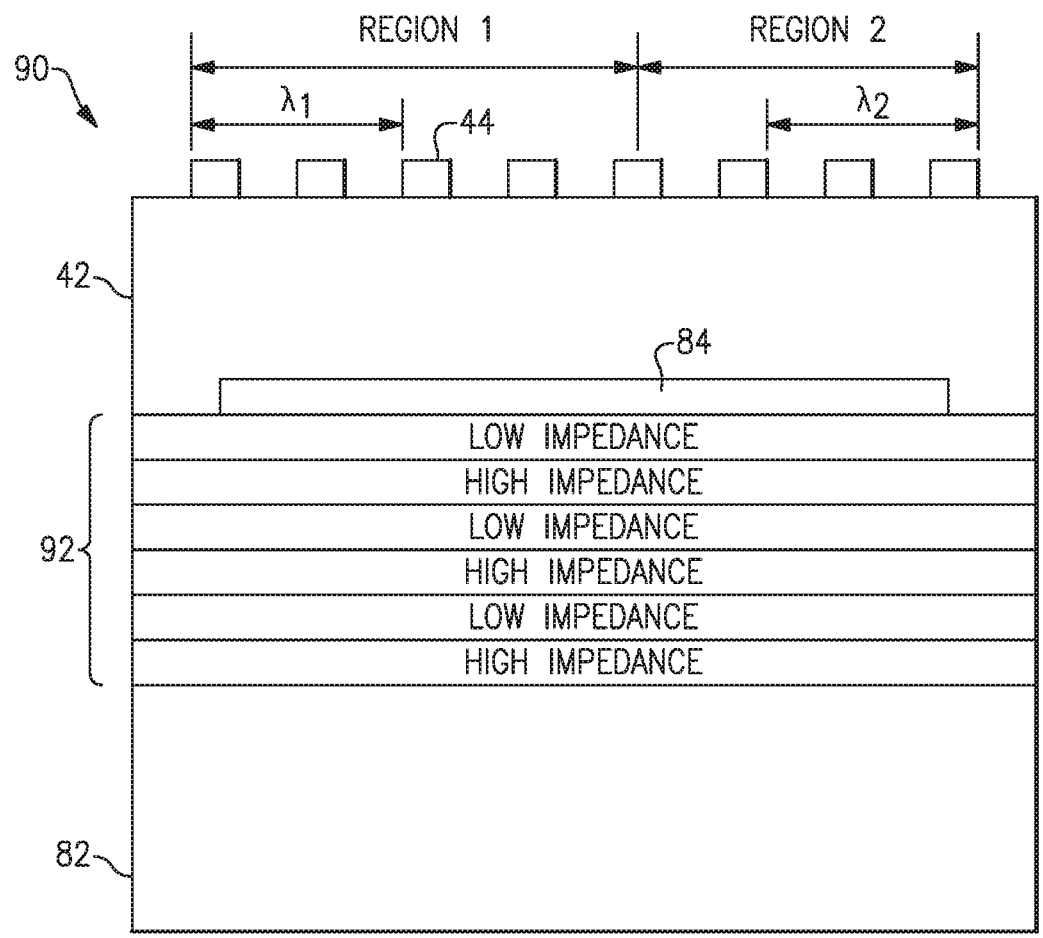
FIG. 9 is a diagram of a cross section of a solidly mounted Lamb wave resonator according to an embodiment.

FIG. 9 is a diagram of a cross section of a solidly mounted Lamb wave resonator 90 according to an embodiment. The solidly mounted Lamb wave resonator 90 is an example of an acoustic wave resonator having multiple resonant frequencies. Acoustic wave filters disclosed herein can include any suitable number of solidly mounted Lamb wave resonators 90. As illustrated, the solidly mounted Lamb wave resonator 90 includes an electrode 84, a piezoelectric layer 42, an IDT electrode 44 on the piezoelectric layer 42, and a Bragg reflector 92 located between the substrate 82 and the electrode 84. The Bragg reflector 92 includes alternating low impedance and high impedance layers. As an example, the Bragg reflector 92 can include alternating silicon dioxide layers and tungsten layers. Any other suitable Bragg reflector can alternatively or additionally be included in the solidly mounted Lamb wave resonator 90. In the solidly mounted Lamb wave resonator 90, the piezoelectric layer 42 can be an aluminum nitride layer, for example. As shown in FIG. 9, the IDT electrode 44 includes first IDT electrode fingers in Region 1 having a pitch of $\lambda 1$ and second IDT electrode fingers in Region 2 having a pitch of $\lambda 2$. These different pitches correspond to different resonant frequencies of the solidly mounted Lamb wave resonator 90. Alternatively or additionally, thickness of the piezoelectric layer 42 in the solidly mounted Lamb wave resonator 90 can be different in Region 1 and Region 2 to cause a difference in resonant frequency between Region 1 and Region 2.

Although embodiments disclosed herein relate to acoustic wave resonators with two resonant frequencies, any suitable principles and advantages disclosed herein can be implemented in an acoustic wave resonator having three or more resonant frequencies. With three or more resonant frequencies, corresponding notches in the frequency response of an acoustic wave resonator can be less deep than for a similar acoustic wave resonator with two resonant frequencies. Accordingly, such an acoustic wave resonator can be implemented in applications in which such notch depth can contribute to a specification for a frequency response of a filter. An example IDT electrode for an acoustic wave resonator having three resonant frequencies will be discussed with reference to FIG. 10. An IDT electrode in an acoustic wave resonator with three or more resonant frequencies can include a sufficient number of IDT electrode fingers to provide a sufficiently high quality factor (Q) for particular applications.

Figure 10:
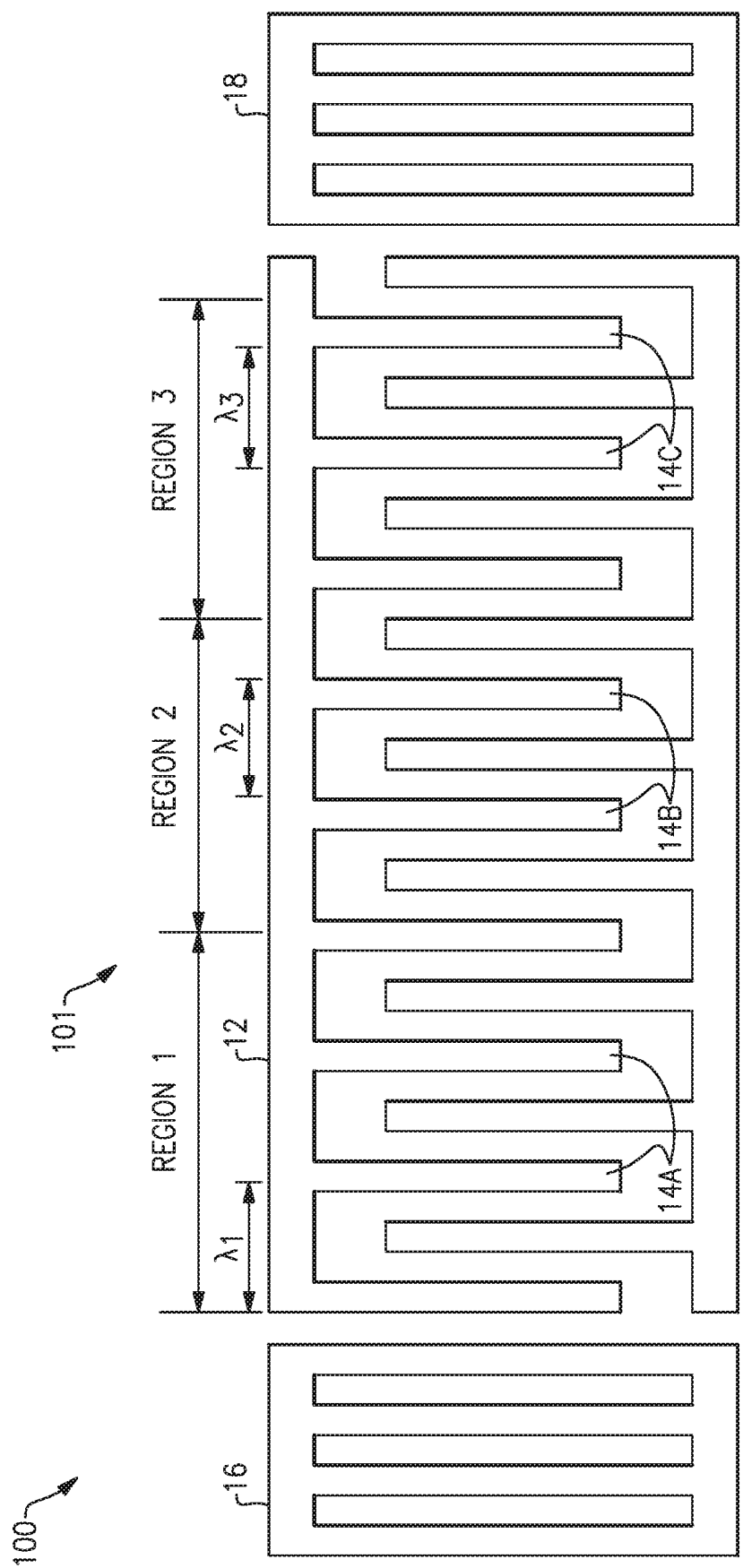
FIG. 10 is a diagram of an acoustic wave resonator with an IDT electrode with three different pitches between IDT fingers according to an embodiment.

FIG. 10 is a diagram of an acoustic wave resonator 100 with an IDT electrode 101 with three different pitches between IDT fingers according to an embodiment. The acoustic wave resonator 100 is shown in plan view. The acoustic wave resonator 100 can be a SAW resonator in certain embodiments. The IDT electrode 101 is similar to the IDT electrode 11 of FIG. 1 except that the IDT electrode 101 additionally includes third IDT fingers 14C having a third pitch $\lambda 3$. As illustrated, the acoustic wave resonator 100 includes an IDT electrode 101 including a bus bar 12 and IDT fingers 14A to 14C, a first acoustic reflector 16, and a second acoustic reflector 18.

The IDT electrode 101 includes a bus bar 12 and IDT fingers 14A, 14B, and 14C extending from the bus bar 12. In Region 1 of the acoustic wave resonator 101, first IDT fingers 14A have a pitch of $\lambda 1$. The acoustic wave resonator 100 can include any suitable number of first IDT fingers 14A. The pitch $\lambda 1$ of the first IDT fingers 14A corresponds to a first resonant frequency. In Region 2 of the acoustic wave resonator 100, second IDT fingers 14B have a pitch of $\lambda 2$. The acoustic wave resonator 100 can include any suitable number of second IDT fingers 14B. The pitch $\lambda 2$ of the second IDT fingers 14B corresponds to a second resonant frequency. In Region 3 of the acoustic wave resonator 100, third IDT fingers 14C have a pitch of $\lambda 3$. The acoustic wave resonator 100 can include any suitable number of third IDT fingers 14C. The pitch $\lambda 3$ of the third IDT fingers 14C corresponds to a third resonant frequency. Accordingly, the acoustic wave resonator 100 has IDT fingers with three different pitches that correspond to three different resonant frequencies.

Acoustic wave resonators having multiple resonant frequencies can be implemented in a variety of different filters. Example filters include without limitation notch filters with notches created by the resonant frequencies of shunt resonator(s), ladder filters, lattice filters, and hybrid filters that use shunt resonator resonant frequencies for rejection.

One or more acoustic wave resonators including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more SAW resonators disclosed herein. FR1 can be from 410 megahertz (MHz) to 7.125 gigahertz (GHz), for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band. One or more acoustic wave resonators in accordance with any suitable principles and advantages disclosed herein can be included in a filter having a passband that includes a 4G LTE operating band and a 5G NR operating band.

Figure 11:
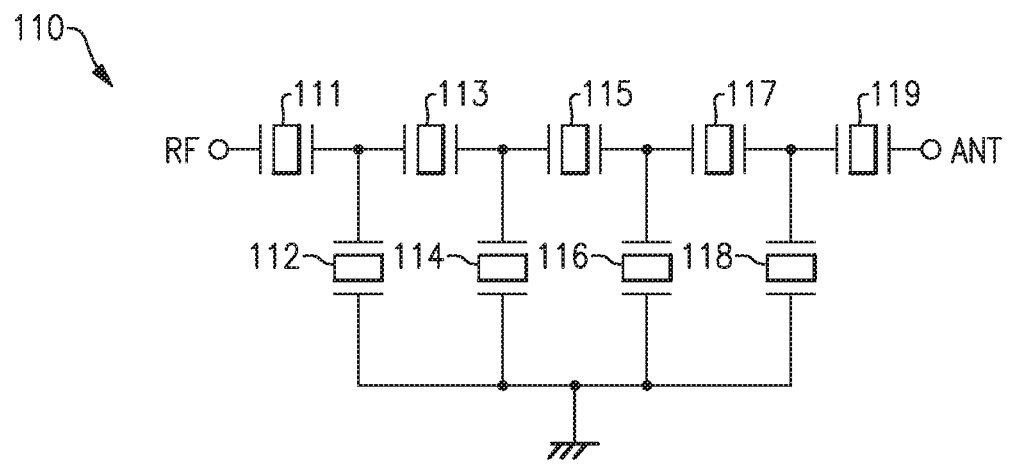
FIG. 11 is a schematic diagram of a ladder filter that includes a shunt resonator according to an embodiment.

Acoustic wave filters disclosed herein can have a ladder filter topology. FIG. 11 is a schematic diagram of a ladder filter 110 that includes a shunt resonator according to an embodiment. The ladder filter 110 is an example topology of a band pass filter formed from acoustic wave resonators. In a band pass filter with a ladder filter topology, the shunt resonators can have lower resonant frequencies than the series resonators. The ladder filter 110 can be arranged to filter an RF signal. As illustrated, the ladder filter 110 includes series acoustic wave resonators 111, 113, 115, 117, and 119 and shunt acoustic wave resonators 112, 114, 116, and 118 coupled between an RF port RF and an antenna port ANT. The acoustic wave resonators of the ladder filter 110 can include any suitable acoustic wave resonators. The RF port can be a transmit port for a transmit filter or a receive port for a receive filter. Any suitable number of series acoustic wave resonators can be in included in a ladder filter. Any suitable number of shunt acoustic wave resonators can be included in a ladder filter. Any of the illustrated shunt acoustic wave resonators 112, 114, 116, and 118 can have multiple resonant frequencies in accordance with any suitable principles and advantages disclosed herein. In certain instances, a single shunt resonator of the ladder filter 110 has multiple resonant frequencies in accordance with any suitable principles and advantages disclosed herein. In some other instances, two or more shunt resonators of the ladder filter 110 can have multiple resonant frequencies in accordance with any suitable principles and advantages disclosed herein.

Figure 12:
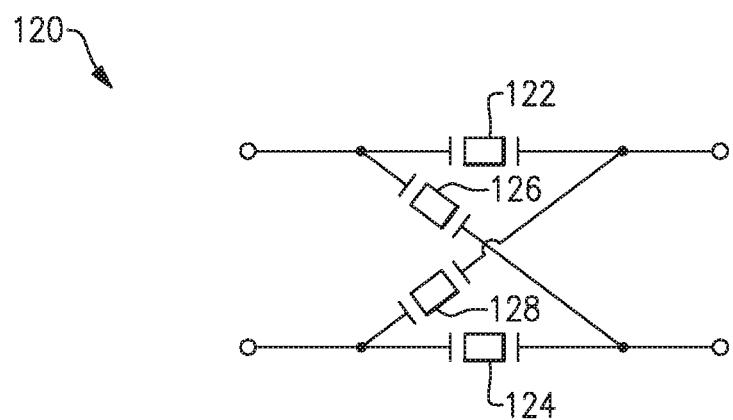
FIG. 12 is a schematic diagram of a lattice filter that includes a resonator according to an embodiment.

Acoustic wave filters disclosed herein can have a lattice filter topology. FIG. 12 is a schematic diagram of a lattice filter 120 that includes a resonator according to an embodiment. The lattice filter 120 is an example topology of a band pass filter formed from acoustic wave resonators. The lattice filter 120 can be arranged to filter an RF signal. As illustrated, the lattice filter 120 includes acoustic wave resonators 122, 124, 126, and 128. The acoustic wave resonators 122 and 124 are considered series resonators. The acoustic wave resonators 126 and 128 are considered shunt resonators. The illustrated lattice filter 120 has a balanced input and a balanced output. The illustrated acoustic wave resonators 126 and/or 128 can have multiple resonant frequencies in accordance with any suitable principles and advantages disclosed herein.

In some instances, an acoustic wave filter that includes a shunt resonator having two or more resonant frequencies can have a topology that is a hybrid of a ladder filter and a lattice filter. According to certain applications, an acoustic wave shunt resonator having two or more resonant frequencies can be included in filter that also includes one or more inductors and one or more capacitors.

Figures 13A, 13B:
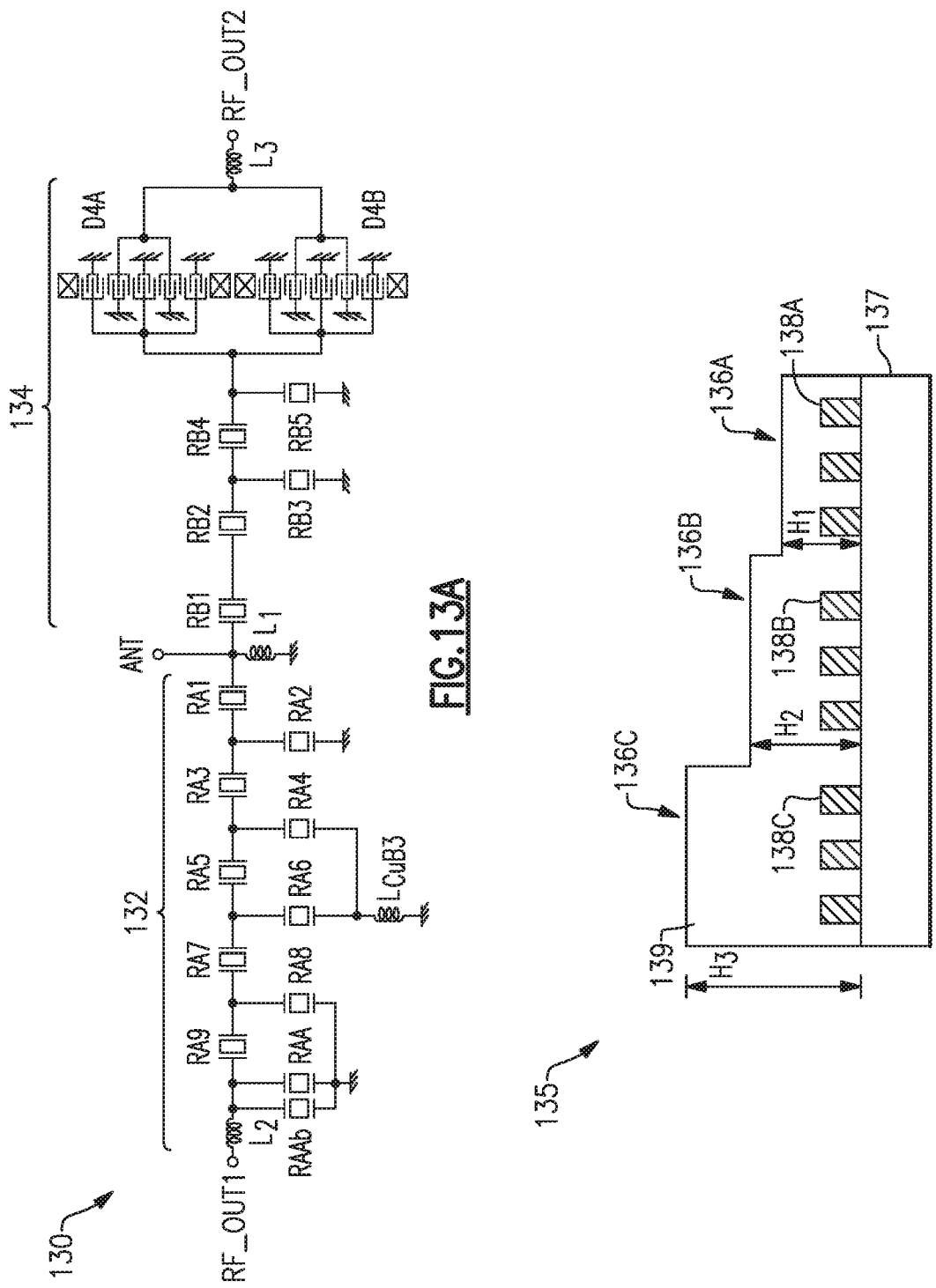
FIG. 13A is a schematic diagram of a duplexer according to an embodiment.
FIG. 13B is a schematic diagram of a cross section of surface acoustic wave resonators of the duplexer of FIG. 13A according to an embodiment.

FIG. 13A is a schematic diagram of a duplexer 130 according to an embodiment. The duplexer 130 includes a first filter 132 and a second filter 134 coupled together at an antenna node ANT. The antenna node ANT is a common node of the duplexer 130. A shunt inductor L1 is also coupled to the first filter 132 and 134 at the antenna node ANT. The duplexer 130 can be a diversity receive duplexer in which the first filter 132 is a receive filter and the second filter 134 is a receive filter. As an illustrative example, the first filter 132 can be a Band 3 receive filter and the second filter 134 can be a Band 66 receive filter.

The first filter 132 includes a plurality of acoustic wave resonators. As illustrated, the first filter 132 is a ladder filter. The acoustic wave resonators of the first filter 132 include series resonators RA1, RA3, RA5, RA7, and RA9 and shunt resonators RA2, RA4, RA6, RA8, RAA, and RAAb. One or more of the shunt resonators RA2, RA4, RA6, RA8, RAA, and RAAb can have a plurality of resonant frequencies. The first filter 132 also includes a series inductor L2 coupled between the plurality of acoustic wave resonators and an RF port RF_OUT1. The first filter 132 includes a shunt inductor LCuB3. In certain applications, the first filter 132 can have the frequency response shown in FIGS. 3C and 3D. In such applications, the shunt resonator RA2 can have two resonant frequencies corresponding to the curve in FIG. 3D.

The second filter 134 includes a plurality of acoustic wave resonators. The acoustic wave resonators of the second filter 134 include series resonators RB1, RB2, and RB4, shunt resonators RB3 and RB5, and double mode SAW (DMS) elements D4A and D4B. The shunt resonator RB3 and/or the shunt resonator RB4 can have a plurality of resonant frequencies in accordance with any suitable principles and advantages disclosed herein in certain embodiments. The second filter 134 also includes a series inductor L3 coupled between the plurality of acoustic wave resonators and an RF port RF_OUT2.

Acoustic wave resonators of the duplexer 130 can be TCSAW resonators. Such TCSAW resonators can have temperature compensation layers of different thicknesses. FIG. 13B is a schematic diagram of a cross section of surface acoustic wave resonators of the duplexer 130 of FIG. 13A according to an embodiment. As shown in FIG. 13B, an acoustic wave component 135 includes TCSAW resonators 136A, 136B, and 136C. One or more of the TCSAW resonators 136A, 136B, and 136C can have two or more resonant frequencies in accordance with any suitable principles and advantages disclosed herein. The acoustic wave component 135 includes a piezoelectric layer 137 and IDT electrodes 138A, 138B, and 138C on the piezoelectric layer 137. A temperature compensation layer 139 is positioned over the IDT electrodes 138A, 138B, and 138C and the piezoelectric layer 137. The piezoelectric layer 137 can be a lithium niobate layer. The temperature compensation layer 139 can be a silicon dioxide layer.

The temperature compensation layer 139 has a plurality of different thicknesses over respective IDT electrodes 138A, 138B, and 138C. The temperature compensation layer 139 being thicker can result in TCF closer to zero and lower Q and electromechanical coupling coefficient ($k^2$). The temperature compensation layer 139 can be have different thicknesses such that certain resonators have TCF closer to zero and other resonators have higher Q and $k^2$. The first TCSAW resonator 136A has a first thickness H1 of the temperature compensation layer 139 over the piezoelectric layer 137. The second TCSAW resonator 136B has a second thickness H2 of the temperature compensation layer 139 over the piezoelectric layer 137. The third TCSAW resonator 136C has a third thickness H3 of the temperature compensation layer 139 over the piezoelectric layer 137. As shown in FIG. 13B, the third thickness H3 is greater than the second thickness H2 and the second thickness H2 is greater than the first thickness.

In an embodiment of the duplexer 130, acoustic wave resonators RA1, RB1, RB2, RB4 can be TCSAW resonators with the first thickness H1 like the TCSAW resonator 136A, acoustic wave resonators RA7, RA9, RB3, and RB5 can be TCSAW resonators with the second thickness H2 like the TCSAW resonator 136B, and acoustic wave resonators RA2, RA3, RA4, RA5, RA6, RA8, RAA, and RAAb can be TCSAW resonators with the third thickness H3 like the TCSAW resonator 136C.

Figure 14A:
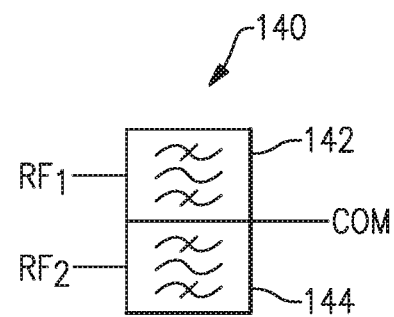
FIG. 14A is a schematic diagram of a duplexer that includes an acoustic wave filter according to an embodiment.

FIG. 14A is a schematic diagram of a duplexer 140 that includes an acoustic wave filter according to an embodiment. The duplexer 140 includes a first filter 142 and a second filter 144 coupled to together at a common node COM. One of the filters of the duplexer 140 can be a transmit filter and the other of the filters of the duplexer 140 can be a receive filter. The transmit filter and the receive filter can be respective ladder filters with acoustic wave resonators having a topology similar to the ladder filter 110 of FIG. 11. In some other instances, such as in a diversity receive application, the duplexer 140 can include two receive filters. The common node COM can be an antenna node.

The first filter 142 is an acoustic wave filter arranged to filter a radio frequency signal. The first filter 142 can include acoustic wave resonators coupled between a first radio frequency node RF1 and the common node. The first radio frequency node RF1 can be a transmit node or a receive node. The first filter 142 includes a shunt acoustic wave resonator having multiple resonant frequencies in accordance with any suitable principles and advantages disclosed herein.

The second filter 144 can be any suitable filter arranged to filter a second radio frequency signal. The second filter 144 can be, for example, an acoustic wave filter, an acoustic wave filter that includes shunt resonator with multiple resonant frequencies, an LC filter, a hybrid acoustic wave LC filter, or the like. The second filter 144 is coupled between a second radio frequency node RF2 and the common node. The second radio frequency node RF2 can be a transmit node or a receive node Although example embodiments may be discussed with filters or duplexers for illustrative purposes, any suitable principles and advantages disclosed herein can be implement in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. One or more filters of a multiplexer can include a shunt acoustic wave resonator having multiple resonant frequencies. Multiplexers include multiplexers with fixed multiplexing and multiplexers with switched multiplexing.

Figure 14B:
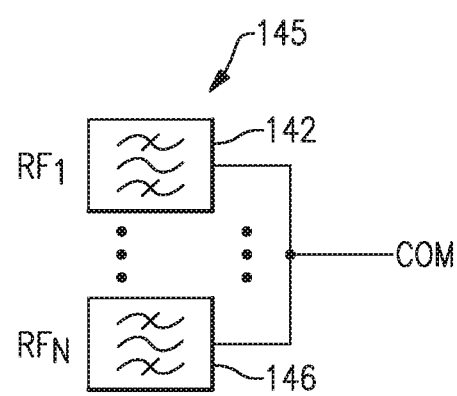
FIG. 14B is a schematic diagram of a multiplexer that includes an acoustic wave filter according to an embodiment.

FIG. 14B is a schematic diagram of a multiplexer 145 that includes an acoustic wave filter according to an embodiment. The multiplexer 145 includes a plurality of filters 142 to 144 coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters.

The first filter 142 is an acoustic wave filter arranged to filter a radio frequency signal. The first filter 142 can include acoustic wave resonators coupled between a first radio frequency node RF1 and the common node. The first radio frequency node RF1 can be a transmit node or a receive node. The first filter 142 includes a shunt acoustic wave resonator having multiple resonant frequencies in accordance with any suitable principles and advantages disclosed herein. The other filter(s) of the multiplexer 145 can include one or more acoustic wave filters, one or more acoustic wave filters that include a shunt resonator with multiple resonant frequencies, one or more LC filters, one or more hybrid acoustic wave LC filters, or any suitable combination thereof.

The acoustic wave resonators with multiple resonant frequencies disclosed herein can be implemented in a variety of packaged modules. Some example packaged modules will now be disclosed in which any suitable principles and advantages of the acoustic wave filters and/or acoustic wave resonators disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 15 to 18 are schematic block diagrams of illustrative packaged modules according to certain embodiments. Any suitable combination of features of these packaged modules can be implemented with each other. While duplexers are illustrated in the example packaged modules of FIGS. 16 to 18, any other suitable multiplexer that includes a plurality of filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

Figure 15:
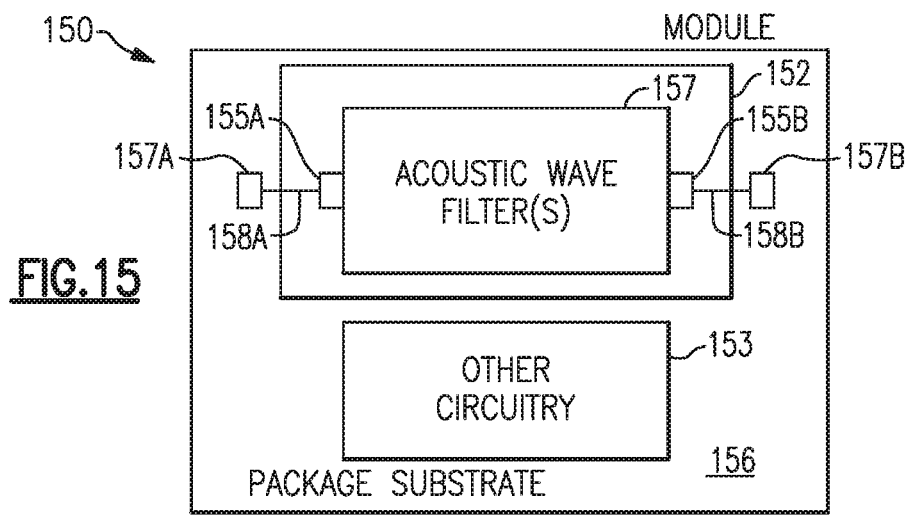
FIG. 15 is a schematic diagram of a radio frequency module that includes an acoustic wave filter according to an embodiment.

FIG. 15 is a schematic diagram of a radio frequency module 150 that includes an acoustic wave component 152 according to an embodiment. The illustrated radio frequency module 150 includes the acoustic wave component 152 and other circuitry 153. The acoustic wave component 152 can include one or more acoustic wave in accordance with any suitable combination of features of the acoustic wave filters and/or acoustic wave resonators disclosed herein. The acoustic wave component 152 can include a SAW die that includes SAW resonators, for example.

The acoustic wave component 152 shown in FIG. 15 includes one or more acoustic wave filters 154 and terminals 155A and 155B. The one or more acoustic wave filters 154 includes an acoustic wave resonator having multiple resonant frequencies implemented in accordance with any suitable principles and advantages disclosed herein. The terminals 155A and 154B can serve, for example, as an input contact and an output contact. Although two terminals are illustrated, any suitable number of terminals can be implemented for a particular application. The acoustic wave component 152 and the other circuitry 153 are on a common packaging substrate 156 in FIG. 15. The package substrate 156 can be a laminate substrate. The terminals 155A and 155B can be electrically connected to contacts 157A and 157B, respectively, on the packaging substrate 156 by way of electrical connectors 158A and 158B, respectively. The electrical connectors 158A and 158B can be bumps or wire bonds, for example.

The other circuitry 153 can include any suitable additional circuitry. For example, the other circuitry can include one or more power amplifiers, one or more radio frequency switches, one or more additional filters, one or more low noise amplifiers, one or more RF couplers, one or more delay lines, one or more phase shifters, the like, or any suitable combination thereof. The other circuitry 153 can be electrically connected to the one or more acoustic wave filters 154. The radio frequency module 150 can include one or more packaging structures to, for example, provide protection and/or facilitate easier handling of the radio frequency module 150. Such a packaging structure can include an overmold structure formed over the packaging substrate 156. The overmold structure can encapsulate some or all of the components of the radio frequency module 150.

Figure 16:
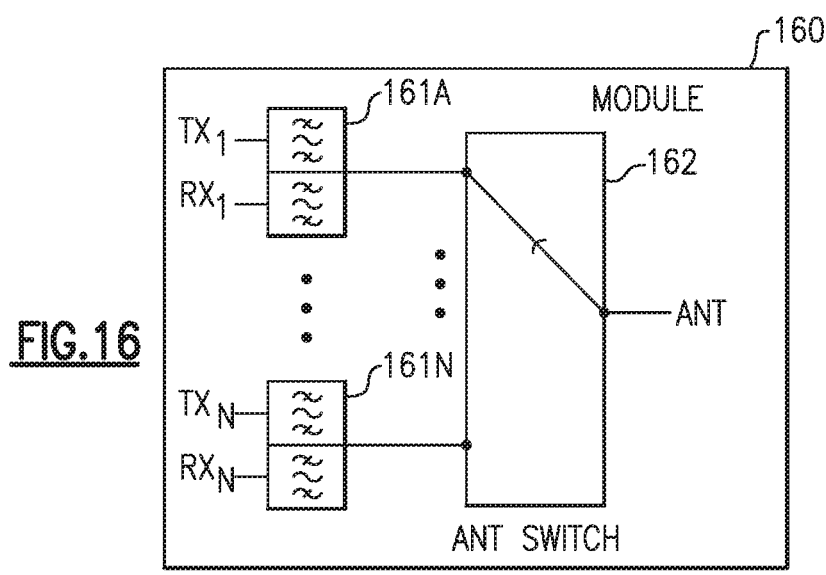
FIG. 16 is a schematic block diagram of a module that includes an antenna switch and duplexers according to an embodiment.

FIG. 16 is a schematic block diagram of a module 160 that includes duplexers 161A to 161N and an antenna switch 162. One or more filters of the duplexers 161A to 161N can include an acoustic wave resonator with two or more resonant frequencies in accordance with any suitable principles and advantages disclosed herein. Any suitable number of duplexers 161A to 161N can be implemented. The antenna switch 162 can have a number of throws corresponding to the number of duplexers 161A to 161N. The antenna switch 162 can include one or more additional throws coupled to one or more filters external to the module 160 and/or coupled to other circuitry. The antenna switch 162 can electrically couple a selected duplexer to an antenna port of the module 160.

Figure 17:
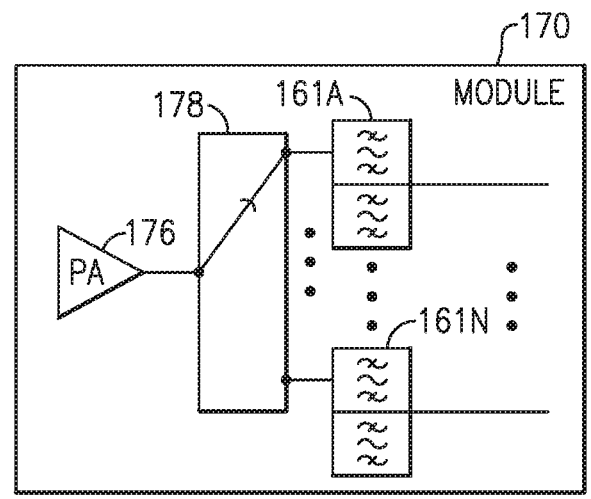
FIG. 17 is a schematic block diagram of a module that includes a power amplifier, a radio frequency switch, and duplexers according to an embodiment.

FIG. 17 is a schematic block diagram of a module 170 that includes a power amplifier 176, a radio frequency switch 178, and duplexers 161A to 161N according to an embodiment. The power amplifier 176 can amplify a radio frequency signal. The radio frequency switch 178 can be a multi-throw radio frequency switch. The radio frequency switch 178 can electrically couple an output of the power amplifier 176 to a selected transmit filter of the duplexers 161A to 161N. One or more filters of the duplexers 161A to 161N can include any suitable number of acoustic wave resonators that have a plurality of resonant frequencies in accordance with any suitable principles and advantages disclosed herein. Any suitable number of duplexers 161A to 161N can be implemented.

Figure 18:
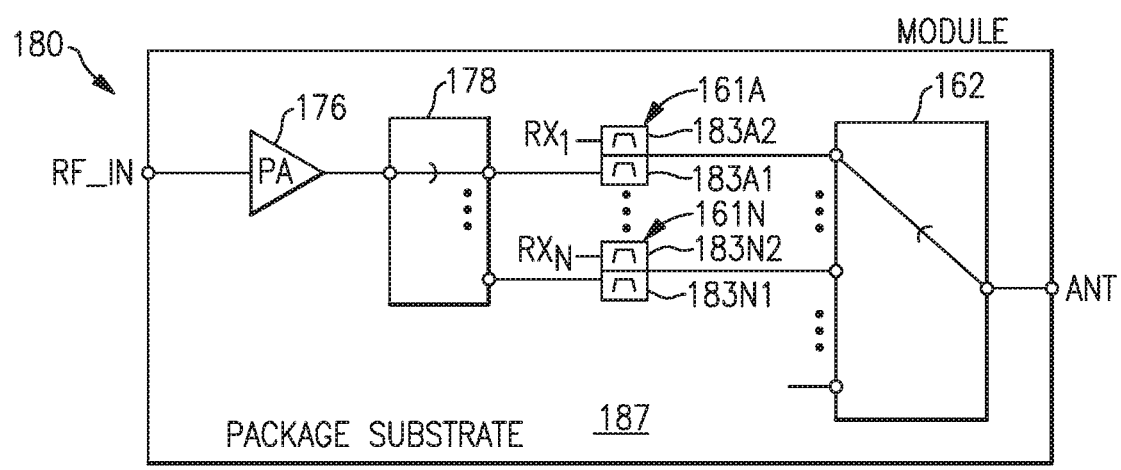
FIG. 18 is a schematic diagram of a radio frequency module that includes an acoustic wave filter according to an embodiment.

FIG. 18 is a schematic diagram of a radio frequency module 180 that includes an acoustic wave filter according to an embodiment. As illustrated, the radio frequency module 180 includes duplexers 161A to 161N that include respective transmit filters 183A1 to 183N1 and respective receive filters 183A2 to 183N2, a power amplifier 176, a select switch 178, and an antenna switch 162. The radio frequency module 180 can include a package that encloses the illustrated elements. The illustrated elements can be disposed on a common packaging substrate 187. The packaging substrate 187 can be a laminate substrate, for example. A radio frequency module that includes a power amplifier can be referred to as a power amplifier module. A radio frequency module can include a subset of the elements illustrated in FIG. 18 and/or additional elements. The radio frequency module 180 may include any one of the acoustic wave devices with a plurality of resonant frequencies in accordance with any suitable principles and advantages disclosed herein.

The duplexers 161A to 161N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters 183A1 to 183N1 can include an acoustic wave resonator with a plurality of resonant frequencies in accordance with any suitable principles and advantages disclosed herein.

Similarly, one or more of the receive filters 183A2 to 183N2 can include an acoustic wave resonator with a plurality of resonant frequencies in accordance with any suitable principles and advantages disclosed herein. Although FIG. 18 illustrates duplexers, any suitable principles and advantages disclosed herein can be implemented in other multiplexers (e.g., quadplexers, hexaplexers, octoplexers, etc.) and/or in switch-plexers.

The power amplifier 176 can amplify a radio frequency signal. The illustrated switch 178 is a multi-throw radio frequency switch. The switch 178 can electrically couple an output of the power amplifier 176 to a selected transmit filter of the transmit filters 183A1 to 183N1. In some instances, the switch 178 can electrically connect the output of the power amplifier 176 to more than one of the transmit filters 183A1 to 183N1. The antenna switch 162 can selectively couple a signal from one or more of the duplexers 161A to 161N to an antenna port ANT. The duplexers 161A to 161N can be associated with different frequency bands and/or different modes of operation (e.g., different power modes, different signaling modes, etc.).

Figure 19A:
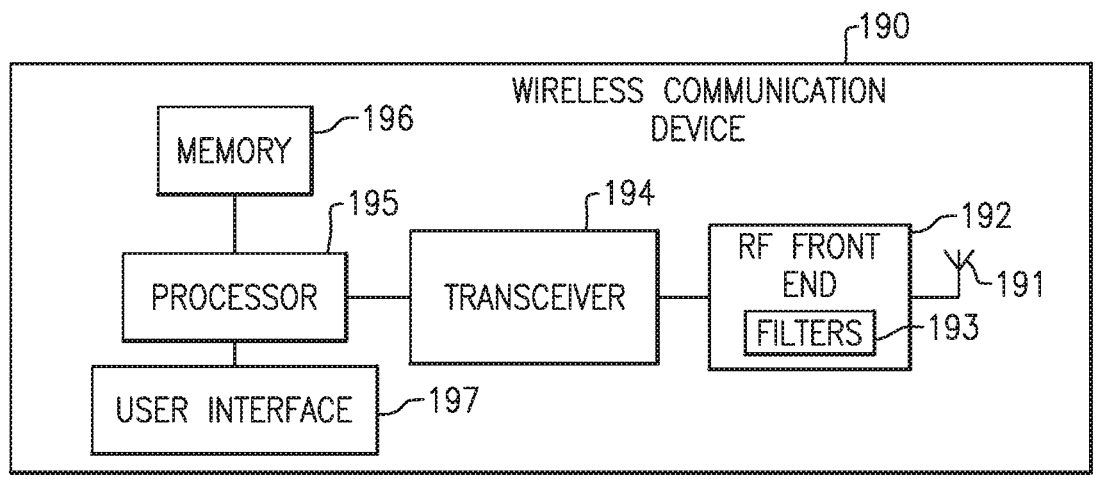
FIG. 19A is a schematic block diagram of a wireless communication device that includes an acoustic wave filter according to an embodiment.

The filters with an acoustic wave resonator having a plurality of resonant frequencies disclosed herein can be implemented in a variety of wireless communication devices. FIG. 19A is a schematic diagram of a wireless communication device 190 that includes filters 193 in a radio frequency front end 192 according to an embodiment. One or more of the filters 193 can an acoustic wave resonator having a plurality of resonant frequencies in accordance with any suitable principles and advantages disclosed herein. The wireless communication device 190 can be any suitable wireless communication device. For instance, a wireless communication device 190 can be a mobile phone, such as a smart phone. As illustrated, the wireless communication device 190 includes an antenna 191, an RF front end 192, a transceiver 194, a processor 195, a memory 196, and a user interface 197. The antenna 191 can transmit RF signals provided by the RF front end 192. Such RF signals can include carrier aggregation signals. The antenna 191 can receive RF signals and provide the received RF signals to the RF front end 192 for processing. Such RF signals can include carrier aggregation signals. The wireless communication device 190 can include two or more antennas in certain instances.

The RF front end 192 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 192 can transmit and receive RF signals associated with any suitable communication standards. One or more of the filters 193 can include an acoustic wave resonator with a plurality of resonant frequencies that includes any suitable combination of features of the embodiments disclosed above.

The transceiver 194 can provide RF signals to the RF front end 192 for amplification and/or other processing. The transceiver 194 can also process an RF signal provided by a low noise amplifier of the RF front end 192. The transceiver 194 is in communication with the processor 195. The processor 195 can be a baseband processor. The processor 195 can provide any suitable base band processing functions for the wireless communication device 190. The memory 196 can be accessed by the processor 195. The memory 196 can store any suitable data for the wireless communication device 190. The user interface 197 can be any suitable user interface, such as a display with touch screen capabilities.

Figure 19B:
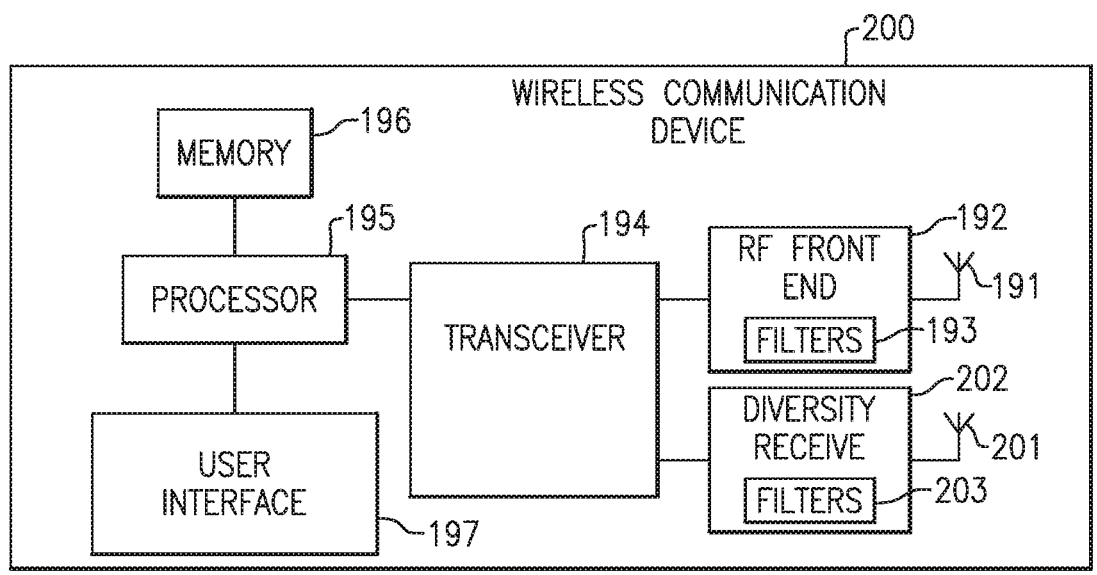
FIG. 19B is a schematic block diagram of another wireless communication device that includes an acoustic wave filter according to an embodiment.

FIG. 19B is a schematic diagram of a wireless communication device 200 that includes filters 193 in a radio frequency front end 192 and second filters 203 in a diversity receive module 202. The wireless communication device 200 is like the wireless communication device 190 of FIG. 19A, except that the wireless communication device 200 also includes diversity receive features. As illustrated in FIG. 19B, the wireless communication device 200 includes a diversity antenna 201, a diversity module 202 configured to process signals received by the diversity antenna 201 and including filters 203, and a transceiver 194 in communication with both the radio frequency front end 192 and the diversity receive module 202. One or more of the second filters 203 can include an acoustic wave resonator having a plurality of resonant frequencies in accordance with any suitable principles and advantages disclosed herein.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz. Acoustic wave filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. An acoustic wave filter configured to filter a radio frequency signal, the acoustic wave filter comprising:
   shunt acoustic wave resonators including a first shunt acoustic wave resonator, the first shunt acoustic wave resonator including an interdigital transducer electrode positioned between a first acoustic reflector and a second acoustic reflector, the first shunt acoustic wave resonator having at least a first resonant frequency corresponding to a first region of the interdigital transducer electrode and a second resonant frequency corresponding to a second region of the interdigital transducer electrode, an outer interdigital transducer electrode finger of the first region being spaced apart from the first acoustic reflector by a first gap, and an outer interdigital transducer electrode finger of the second region being spaced apart from the second acoustic reflector by a second gap; and
   series acoustic wave resonators, the series acoustic wave resonators and the shunt acoustic wave resonators together arranged to filter the radio frequency signal.

2. The acoustic wave filter of claim 1 wherein the acoustic wave filter is a band pass filter having a pass band.

3. The acoustic wave filter of claim 2 wherein the second resonant frequency is between the first resonant frequency and an edge of the pass band.

4. The acoustic wave filter of claim 3 wherein the second resonant frequency is at least 5 megahertz above the first resonant frequency.

5. The acoustic wave filter of claim 1 wherein the acoustic wave filter has a pass band corresponding to a fifth generation New Radio operating band.

6. The acoustic wave filter of claim 1 wherein the first shunt acoustic wave resonator is a surface acoustic wave resonator.

7. The acoustic wave filter of claim 1 wherein the first shunt acoustic wave resonator is a temperature compensated surface acoustic wave resonator, and a first series resonator of the series acoustic wave resonators is a second temperature compensated surface acoustic wave resonator having a thinner temperature compensation layer than the first shunt acoustic wave resonator.

8. The acoustic wave filter of claim 1 wherein the first shunt acoustic wave resonator is a multilayer piezoelectric substrate surface acoustic wave resonator that includes a piezoelectric layer under the interdigital transducer electrode and a support substrate under the piezoelectric layer.

9. The acoustic wave filter of claim 1 wherein the first shunt acoustic wave resonator is a Lamb wave resonator.

10. The acoustic wave filter of claim 1 wherein the first shunt acoustic wave resonator is a boundary acoustic wave resonator.

11. The acoustic wave filter of claim 1 wherein the first shunt acoustic wave resonator has a third resonant frequency.

12. The acoustic wave filter of claim 1 wherein the shunt acoustic wave resonators include a second shunt acoustic wave resonator having a plurality of resonant frequencies.

13. A multiplexer with filters for filtering radio frequency signals, the multiplexer comprising:
a first filter including series acoustic wave resonators and shunt acoustic wave resonators together arranged to filter a first radio frequency signal, the shunt acoustic wave resonators including a first shunt acoustic wave resonator, the first shunt acoustic wave resonator including an interdigital transducer electrode, the first shunt acoustic wave resonator having a plurality of resonant frequencies, the interdigital transducer electrode including first interdigital transducer electrode fingers having a first pitch corresponding to a first resonant frequency of the plurality of resonant frequencies, and the interdigital transducer electrode including second interdigital transducer electrode fingers having a second pitch corresponding to a second resonant frequency of the plurality of resonant frequencies; and
a second filter coupled to the first filter at a common node, the second filter including second series acoustic wave resonators and second shunt acoustic wave resonators, and the second shunt acoustic wave resonators include a second shunt acoustic wave resonator having at least two resonant frequencies, the second filter configured to filter a second radio frequency signal.

14. The multiplexer of claim 13 wherein the interdigital transducer electrode is positioned between a first acoustic reflector and a second acoustic reflector, an outer interdigital transducer electrode finger of the first interdigital transducer electrode fingers is spaced apart from the first acoustic reflector by a first gap, and an outer interdigital transducer electrode finger of the second interdigital transducer electrode fingers is spaced apart from the second acoustic reflector by a second gap.

15. The multiplexer of claim 13 wherein the first shunt acoustic wave resonator includes a piezoelectric layer under the interdigital transducer electrode and a support substrate under the piezoelectric layer.

16. The multiplexer of claim 13 further comprising:
a third filter coupled to the common node, the third filter configured to filter a third radio frequency signal; and
a fourth filter coupled to the common node, the fourth filter configured to filter a fourth radio frequency signal.

17. The multiplexer of claim 16 wherein the multiplexer is configured to provide filtering for at least two carriers of a carrier aggregation.

18. A method of filtering a radio frequency signal with an acoustic wave filter, the method comprising:
receiving, by an acoustic wave filter, the radio frequency signal; and
generating, by a shunt acoustic wave resonator including an interdigital transducer electrode positioned between a first acoustic reflector and a second acoustic reflector and being included in the acoustic wave filter, a plurality of notches in a frequency response of the shunt acoustic wave resonator to thereby improve rejection of the acoustic wave filter, the interdigital transducer electrode including first interdigital transducer electrode fingers having a first pitch corresponding to a first resonant frequency that creates a first notch of the plurality of notches, an outer finger of the first interdigital transducer electrode fingers being separated from the first acoustic reflector by a first gap, the interdigital transducer electrode including second interdigital transducer electrode fingers having a second pitch corresponding to a second resonant frequency that creates a second notch of the plurality of notches, and an outer finger of the second interdigital transducer electrode fingers being separated from the second acoustic reflector by a second gap.

19. The method of claim 18 wherein the radio frequency signal is a fifth generation New Radio signal.

20. The method of claim 19 wherein the acoustic wave filter is a band pass filter having a pass band, and the second resonant frequency is between the first resonant frequency and a lower edge of the pass band.

* * * * *